(12) United States Patent
Abe et al.

(10) Patent No.: US 9,735,163 B2
(45) Date of Patent: Aug. 15, 2017

(54) SEMICONDUCTOR DEVICE

(71) Applicant: Semiconductor Energy Laboratory Co., Ltd., Kanagawa-ken (JP)

(72) Inventors: Takayuki Abe, Tochigi (JP); Yasuyuki Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 9 days.

(21) Appl. No.: 14/473,224

(22) Filed: Aug. 29, 2014

(65) Prior Publication Data
US 2016/0163720 A1     Jun. 9, 2016

Related U.S. Application Data

(63) Continuation of application No. 12/559,033, filed on Sep. 14, 2009, now Pat. No. 8,822,996.

(30) Foreign Application Priority Data

Sep. 19, 2008   (JP) .................................. 2008-241792

(51) Int. Cl.
*H01L 29/76*     (2006.01)
*H01L 27/112*    (2006.01)
(Continued)

(52) U.S. Cl.
CPC .... *H01L 27/11206* (2013.01); *H01L 23/4985* (2013.01); *H01L 23/49833* (2013.01); *H01L 23/49855* (2013.01); *H01L 23/5227* (2013.01); *H01L 23/5252* (2013.01); *H01L 23/5329* (2013.01); *H01L 23/53257* (2013.01); *H01L 23/53271* (2013.01); *H01L 23/66* (2013.01);
(Continued)

(58) Field of Classification Search
CPC ....................... H01L 23/49855; H01L 27/1255

USPC ................................................... 257/295, 296
See application file for complete search history.

(56) References Cited

U.S. PATENT DOCUMENTS 5,070,384 A     12/1991   McCollum et al.
5,717,237 A *   2/1998    Chi ..................... H01L 21/8221
                                                        257/315
(Continued)

FOREIGN PATENT DOCUMENTS

CN       001873997 A    12/2006
CN       101105975 A     1/2008
(Continued)

OTHER PUBLICATIONS

Taiwanese Office Action re Application No. TW 98130922, dated Sep. 2, 2014.
(Continued)

*Primary Examiner* — Samuel Gebremariam
(74) *Attorney, Agent, or Firm* — Husch Blackwell LLP

(57) ABSTRACT

A semiconductor device including a memory cell is provided. The memory cell comprises a transistor, a memory element and a capacitor. One of first and second electrodes of the memory element and one of first and second electrodes of the capacitor are formed by a same metal film. The metal film functioning as the one of first and second electrodes of the memory element and the one of first and second electrodes of the capacitor is overlapped with a film functioning as the other of first and second electrodes of the capacitor.

18 Claims, 21 Drawing Sheets

(51) Int. Cl.
  *H01L 23/498* (2006.01)
  *H01L 23/522* (2006.01)
  *H01L 27/105* (2006.01)
  *H01L 49/02* (2006.01)
  *H01L 29/94* (2006.01)
  *H01L 23/00* (2006.01)
  *H01L 27/12* (2006.01)
  *H01L 23/525* (2006.01)
  *H01L 23/532* (2006.01)
  *H01L 23/66* (2006.01)
  *H01L 27/06* (2006.01)

(52) U.S. Cl.
  CPC .......... *H01L 24/24* (2013.01); *H01L 27/0629* (2013.01); *H01L 27/105* (2013.01); *H01L 27/112* (2013.01); *H01L 27/124* (2013.01); *H01L 27/1255* (2013.01); *H01L 28/60* (2013.01); *H01L 29/94* (2013.01); *H01L 2223/6672* (2013.01); *H01L 2223/6677* (2013.01); *H01L 2924/12044* (2013.01); *H01L 2924/14* (2013.01); *H01L 2924/15788* (2013.01)

(56) References Cited

U.S. PATENT DOCUMENTS

| | | | |
|---|---|---|---|
| 6,051,851 A | 4/2000 | Ohmi et al. |
| 6,787,835 B2 | 9/2004 | Atwood et al. |
| 6,949,782 B2 | 9/2005 | Atwood et al. |
| 7,130,234 B2 | 10/2006 | Shionoiri et al. |
| 7,319,633 B2 | 1/2008 | Shionoiri et al. |
| 7,430,146 B2 | 9/2008 | Shionoiri et al. |
| 7,596,024 B2 | 9/2009 | Kato et al. |
| 7,605,410 B2 | 10/2009 | Takano et al. |
| 7,675,796 B2 | 3/2010 | Kurokawa |
| 7,714,408 B2 | 5/2010 | Tokunaga |
| 7,825,447 B2 | 11/2010 | Kato et al. |
| 7,961,515 B2 | 6/2011 | Kato et al. |
| 8,188,461 B2 | 5/2012 | Sato et al. |
| 8,330,249 B2 | 12/2012 | Tokunaga |
| 8,642,987 B2 | 2/2014 | Takano et al. |
| 2005/0237786 A1 | 10/2005 | Atwood et al. |
| 2006/0267141 A1 | 11/2006 | Saito |
| 2006/0273182 A1 | 12/2006 | Iwata |
| 2007/0171693 A1 | 7/2007 | Koyama |
| 2008/0002454 A1 | 1/2008 | Inoue et al. |
| 2008/0083830 A1 | 4/2008 | Tokunaga et al. |
| 2008/0144374 A1 | 6/2008 | Kato |
| 2008/0203454 A1 | 8/2008 | Asami |
| 2008/0224140 A1 | 9/2008 | Tokunaga et al. |
| 2009/0206381 A1 | 8/2009 | Shin et al. |

FOREIGN PATENT DOCUMENTS

| | | |
|---|---|---|
| EP | 0 452 091 A2 | 10/1991 |
| EP | 1 826 818 A2 | 8/2007 |
| JP | 02-023653 A | 1/1990 |
| JP | 04-226068 A | 8/1992 |
| JP | 10-178098 A | 6/1998 |
| JP | 10-341000 A | 12/1998 |
| JP | 2004-014094 A | 1/2004 |
| JP | 2004-221141 A | 8/2004 |
| JP | 2005-340791 A | 12/2005 |
| JP | 2007-201437 A | 8/2007 |
| JP | 2008-112988 A | 5/2008 |
| JP | 2008-211199 A | 9/2008 |
| JP | 2009-200497 A | 9/2009 |
| TW | 200802806 | 1/2008 |
| WO | WO 2005/106961 A1 | 11/2005 |
| WO | WO 2008/041716 A1 | 4/2008 |

OTHER PUBLICATIONS

Korean Office Action re Application No. KR 2011-7008837, dated Aug. 28, 2015.
International Search Report re Application No. PCT/JP2009/065019, dated Dec. 8, 2009.
Written Opinion re Application No. PCT/JP2009/065019, dated Dec. 8, 2009.
Chinese Office Action re Application No. CN 200980136504.3, dated Sep. 12, 2012.

* cited by examiner

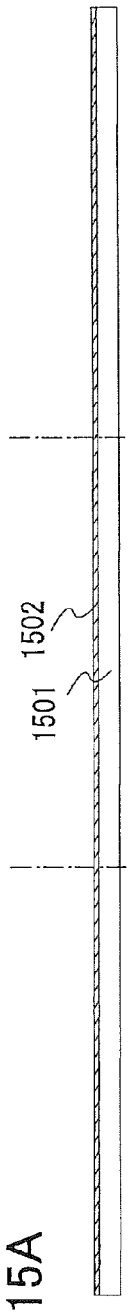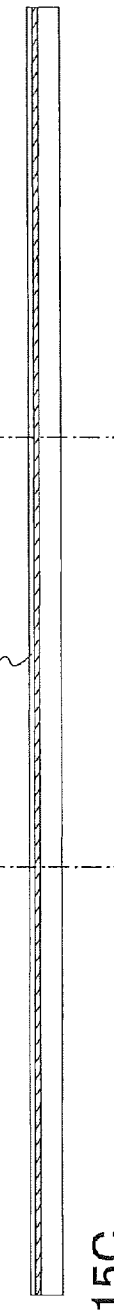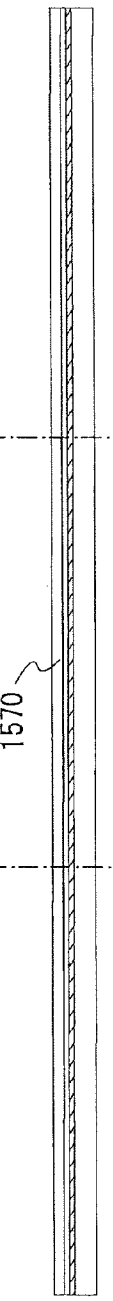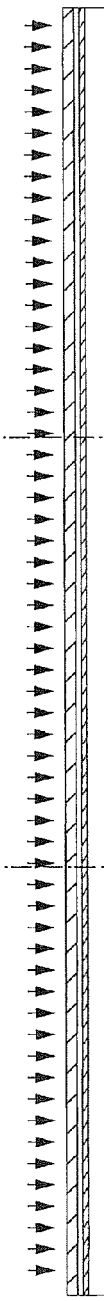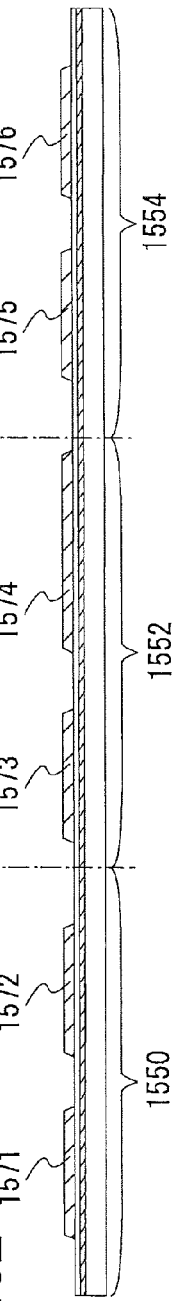

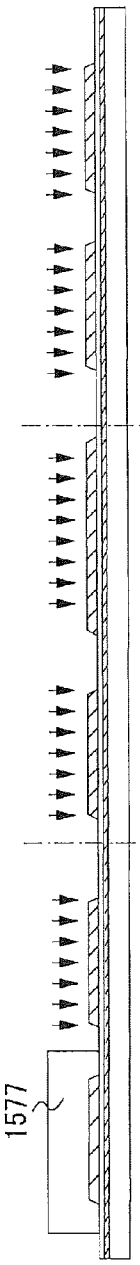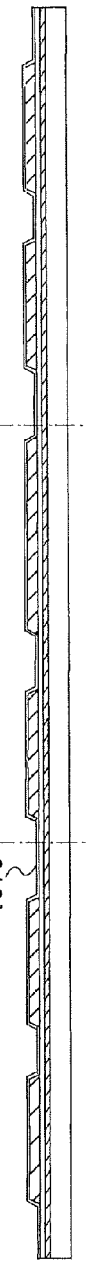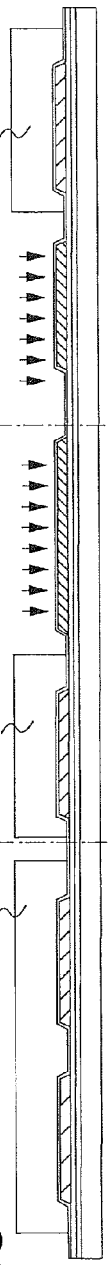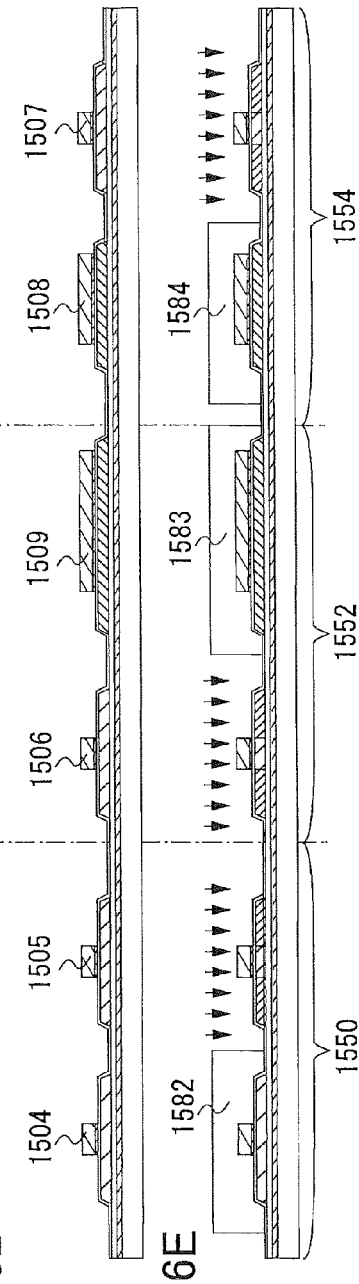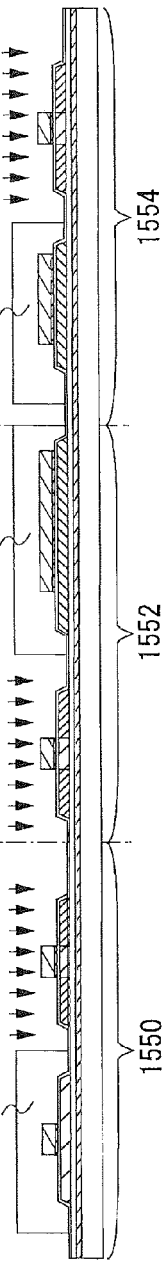
FIG. 16A
FIG. 16B
FIG. 16C
FIG. 16D
FIG. 16E

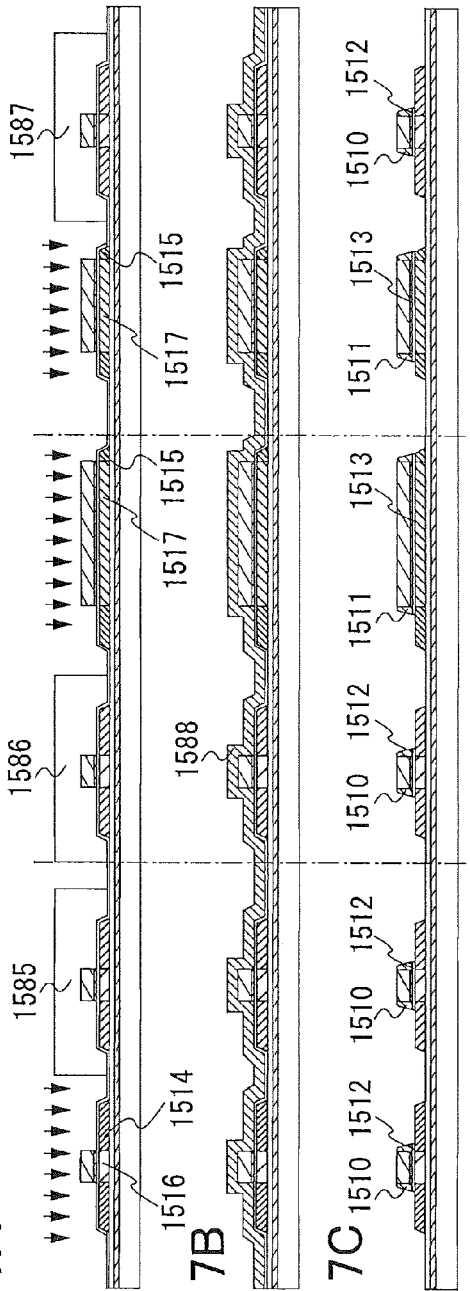

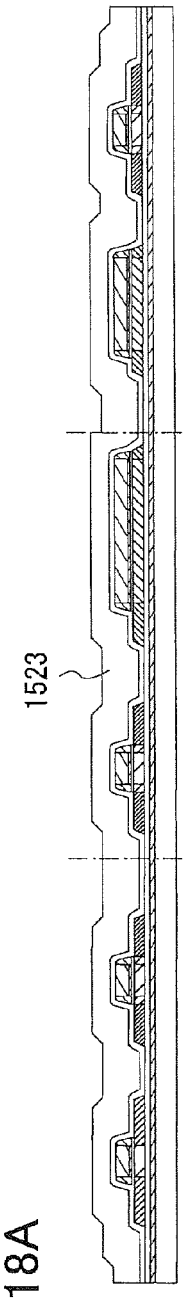
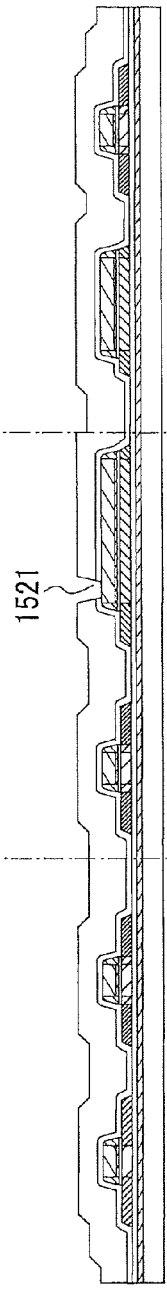
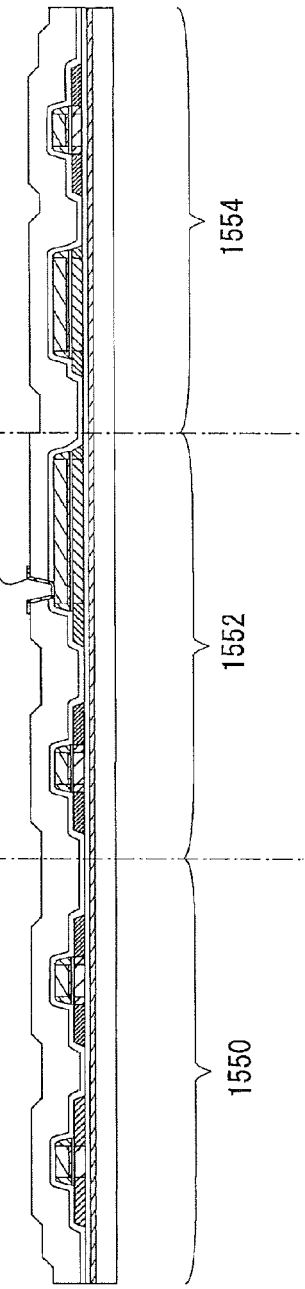
FIG. 18A
FIG. 18B
FIG. 18C

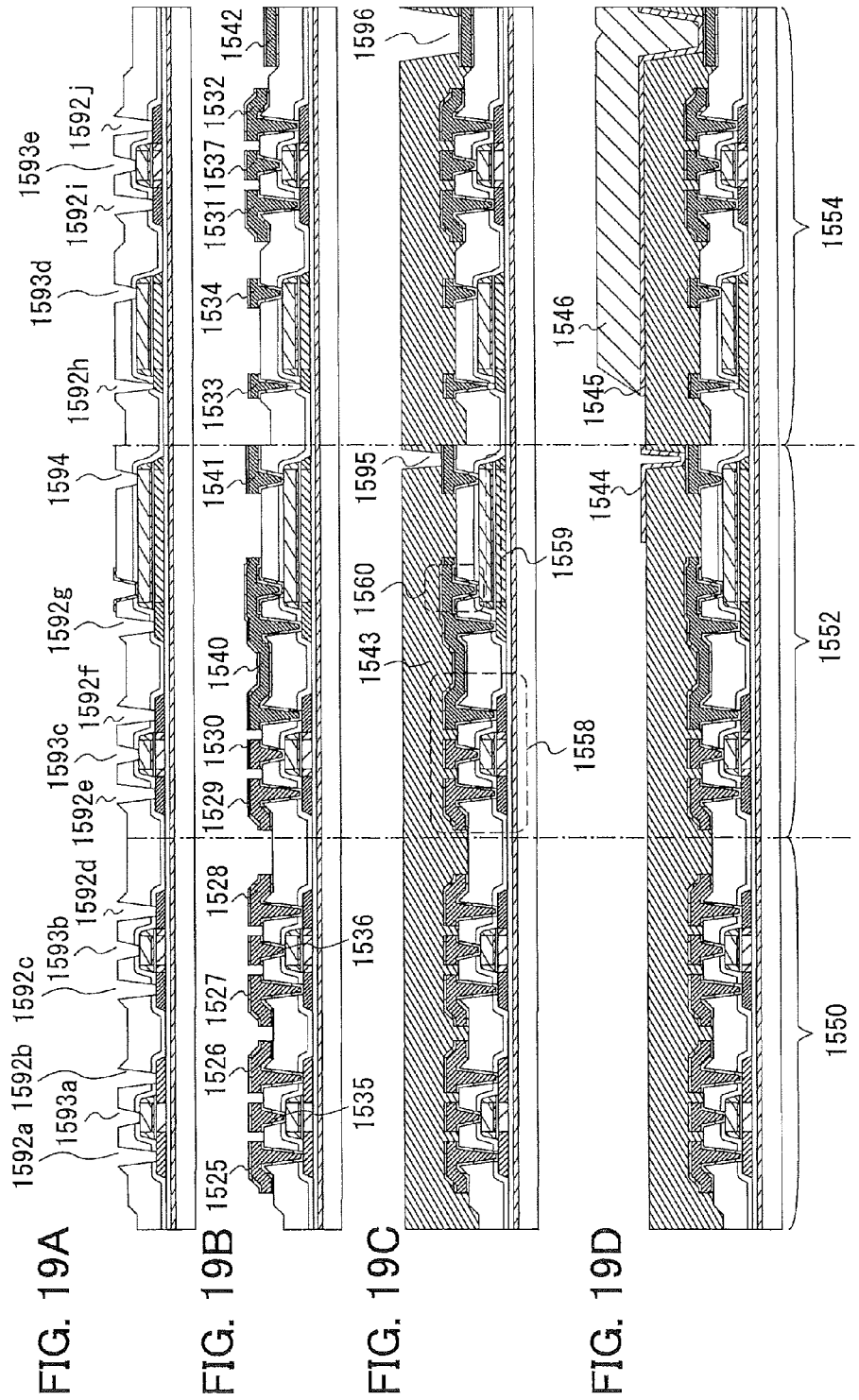

2100

2101

2102

SEMICONDUCTOR DEVICE

This application is a continuation of application Ser. No. 12/559,033 filed on Sep. 14, 2009, which is incorporated herein by reference.

TECHNICAL FIELD

The present invention relates to a semiconductor device and a manufacturing method thereof.

BACKGROUND ART

Memories formed with inorganic semiconductor elements such as silicon have high reliability, low manufacturing cost, and a wide variety of applications, and thus are widely known in general.

Development of novel memories in which inorganic semiconductor elements using silicon or the like, insulating films, and/or wirings are formed over a flexible substrate with use of conventional materials and processes has been actively made.

Memories that are formed on a flexible substrate such as plastics can be embedded in paper, and are considered to be used as name cards, posters or the like for information exchange.

In a development of a one time programmable (OTP) memory, that is, a memory that can write data by breakage of an insulating film and short circuiting between wirings in data writing, when a semiconductor element is formed over a flexible substrate, a manufacturing process and operation of such a one time programmable (OTP) memory are comparatively easy in some cases.

In a memory cell of an anti-fuse type memory, an assist capacitor is disposed to increase writing ability. In a conventional memory, an assist capacitor and a memory element are independently disposed.

An assist capacitor will be described. In parallel writing with an element, a capacitor for supplying charges to the element (hereinafter, referred to as an assist capacitor) is provided so that high yield in writing can be realized. Examples of the assist capacitors include ones including MOS capacitors, which are each formed from "active layer-GI film-metal film", and ones including MIM (Metal-Insulator-Metal) capacitors, which are each formed from "metal film-insulating film-metal film"
[Patent Document 1] Japanese Published Patent Application No. H02-023653

DISCLOSURE OF THE INVENTION

The increase of bit number of memories leads to increase of the area of a memory cell. The percentage of the area occupied by the memory cell of a memory circuit (including a memory cell, decoders, an interface, a booster circuit and the like) is increased as the bit number is larger. This is because in a case where a memory capacitor is N-fold, the areas of a row decoder and a column decoder are each multiples of the square root of N, while the area of the memory cell is N-fold.

FIGS. 21A to 21C schematically illustrate that the area of a memory cell is increased as the number of memory capacitors is increased. A memory circuit 2100 includes a memory cell 2107, a column decoder 2105, a row decoder 2106, an interface 2104, and a booster circuit 2103 which have substantially the same occupation area. A memory circuit 2101 has a bit number four times as large as the memory circuit 2100. A memory circuit 2102 has a bit number sixteen times as large as the memory circuit 2100. In the memory circuit 2100, the percentage of the occupation area of the memory cell is 20%, while the percentage of the occupation area of the memory cell is about 40% in the memory circuit 2101 in which the bit number is four-fold, and the percentage of the occupation area of the memory cell is above 60% in the memory circuit 2102 in which the bit number is sixteen-fold.

This shows that reduction in the area of a memory cell is important in terms of high integration or miniaturization of a memory circuit.

The present invention has been made in view of such a problem, and provides a storage device in which the area of a memory cell is reduced without increasing a process.

A stack of a memory element and an assist capacitor in a memory cell is formed with electrodes of the memory element and the assist capacitor used as a common electrode, and thereby the memory cell is down-sized and thus a chip can be down-sized. Thus, the cost can be reduced.

In an assist capacitor having a MOS structure, writing efficiency can be increased by using a p-type impurity as an impurity added to an active layer.

In order to achieve the above object, one embodiment of the present invention is a semiconductor device comprising a selection transistor; a memory element; and an assist capacitor, wherein one electrode of the memory element and one electrode of the assist capacitor are common; the other electrode of the assist capacitor is formed from a semiconductor film having an impurity; and the one electrode of the memory element and the other electrode of the assist capacitor are overlapped, with an insulating film therebetween.

In order to achieve the above object, one embodiment of the present invention is a semiconductor device comprising a selection transistor; a memory element; and an assist capacitor, wherein a gate electrode of the selection transistor, one electrode of the memory element, and one electrode of the assist capacitor are formed at the same time; the one electrode of the memory element and the one electrode of the assist capacitor are common; an active layer of the selection transistor and the other electrode of the assist capacitor are formed from semiconductor films which are formed at the same time and which are doped with an impurity; an insulating film of the assist capacitor and a gate insulating film of the selection transistor are formed at the same time; and the one electrode of the memory element and the other electrode of the assist capacitor are overlapped, with the insulating film therebetween.

In order to achieve the above object, one embodiment of the present invention is a semiconductor device comprising a selection transistor; a memory element; and an assist capacitor, wherein one electrode of the memory element and one electrode of the assist capacitor are common; one of a source electrode and a drain electrode of the selection transistor is electrically connected to the other electrode of the memory element and the other electrode of the assist capacitor; the other electrode of the assist capacitor is formed from a semiconductor film having an impurity; and the one electrode of the memory element and the other electrode of the assist capacitor are overlapped, with an insulating film therebetween.

In order to achieve the above object, one embodiment of the present invention is a semiconductor device comprising a selection transistor; a memory element; and an assist capacitor, wherein the assist capacitor includes three electrodes and two insulating films; one electrode of the memory element and a first electrode of the assist capacitor are common; a second electrode of the assist capacitor is formed form a semiconductor film having an impurity; the other electrode of the memory element and a third electrode of the assist capacitor are common; a first insulating film of the assist capacitor and a gate insulating film of the selection transistor are formed at the same time; a second insulating film of the assist capacitor and an interlayer insulating film of the selection transistor are formed at the same time; the one electrode of the memory element and the second electrode and the third electrode of the assist capacitor are overlapped, with the first insulating film and the second insulating film therebetween.

The other electrode of the assist capacitor according to one embodiment of the present invention is formed from a semiconductor film having a p-type impurity.

In order to achieve the above object, one embodiment of the present invention is a semiconductor device comprising a selection transistor; a memory element; and an assist capacitor, wherein one electrode of the memory element and one electrode of the assist capacitor are common; the other electrode of the assist capacitor is formed from a metal film; and the one electrode of the memory element and the other electrode of the assist capacitor are overlapped, with an insulating film therebetween.

One electrode of the memory element according to one embodiment of the present invention is formed using tungsten.

The semiconductor device according to one embodiment of the present invention is formed over a flexible substrate.

The semiconductor device according to one embodiment of the present invention is a chip-integration type antenna.

A structure of a method for manufacturing a semiconductor device according to one embodiment of the present invention disclosed in this specification is a method for manufacturing a semiconductor device, comprising the steps of: forming a metal film over a substrate; forming a first insulating film over the metal film; forming a semiconductor film over the first insulating film; etching the semiconductor film to form a first island-shaped semiconductor film and a second island-shaped semiconductor film; forming a second insulating film over the first island-shaped semiconductor film and the second island-shaped semiconductor film; forming a mask over the first island-shaped semiconductor film, and adding a p-type impurity to the second island-shaped semiconductor film with the first island-shaped semiconductor film covered with the mask; removing the mask covering the first island-shaped semiconductor film and forming a metal film over the first island-shaped semiconductor film and the second island-shaped semiconductor film; etching the metal film to form a gate electrode over the first island-shaped semiconductor film and form a first electrode over the second island-shaped semiconductor film; forming a mask over the second island-shaped semiconductor film, and adding an n-type impurity to the first island-shaped semiconductor film with the gate electrode used as a mask and with the second island-shaped semiconductor film covered with the mask; removing the mask covering the second island-shaped semiconductor film, forming a mask over the first island-shaped semiconductor film, and adding a p-type impurity to the second island-shaped semiconductor film with the first electrode used as a mask and with the first island-shaped semiconductor film covered with the mask; removing the mask covering the first island-shaped semiconductor film; forming a third insulating film over the first island-shaped semiconductor film and the second island-shaped semiconductor film; forming sidewalls on the gate electrode and the first electrode by anisotropically etching the third insulating film; removing the second insulating film exposed from the gate electrode, the first electrode, and the sidewall; forming a mask over the second island-shaped semiconductor film, and adding an n-type impurity to the first island-shaped semiconductor film with the second island-shaped semiconductor film covered with the mask; removing the mask covering the second island-shaped semiconductor film; forming a fourth insulating film over the first island-shaped semiconductor film and the second island-shaped semiconductor film; forming a fifth insulating film over the fourth insulating film; forming a first contact hole in the fourth insulating film and the fifth insulating film over the first electrode; forming a layer in the first contact hole; forming second, third, fourth, fifth, and sixth contact holes in the fourth insulating film and the fifth insulating film over the first island-shaped semiconductor film, the gate electrode, the second island-shaped semiconductor film, and the first electrode; wherein the second and fourth contact holes are formed over the first island-shaped semiconductor film; the third contact hole is formed over the gate electrode; the fifth contact hole is formed over the second island-shaped semiconductor film; and the sixth contact hole is formed over the first electrode; forming a metal film over the fifth insulating film and the first to sixth contact holes; etching the metal film so that the first contact hole, the fourth contact hole and fifth contact hole are electrically connected but the second contact hole, the third contact hole, and the sixth contact hole are not electrically connected; and removing the substrate and the metal film to fix the first insulating film to a sheet base.

In the above-described method for manufacturing a semiconductor device, the first electrode and the gate electrode include tungsten.

In the above-described method for manufacturing a semiconductor device, the sheet base is any one of plastics, paper, prepreg, and ceramic sheet.

In the above-described method for manufacturing a semiconductor device, the layer is a stacked layer in which silicon oxynitride is stacked over amorphous silicon.

A stack of a memory element in a memory cell and an assist capacitor is formed, and thereby the memory cell can be down-sized. Thus, the cost can be reduced.

In an assist capacitor having a MOS structure, writing efficiency can be increased by using a p-type impurity as an impurity added to an active layer, and thus the reliability can be improved.

BRIEF DESCRIPTION OF DRAWINGS

In the accompanying drawings:

FIGS. 15A to 15E illustrate a manufacturing process of a semiconductor device including an anti-fuse semiconductor storage device;

FIGS. 16A to 16E illustrate a manufacturing process of a semiconductor device including an anti-fuse semiconductor storage device;

FIGS. 17A to 17E illustrate a manufacturing process of a semiconductor device including an anti-fuse semiconductor storage device;

FIGS. 18A to 18C illustrate a manufacturing process of a semiconductor device including an anti-fuse semiconductor storage device;

FIGS. 19A to 19D illustrate a manufacturing process of a semiconductor device including an anti-fuse semiconductor storage device;

BEST MODE FOR CARRYING OUT THE INVENTION

Embodiment of the present invention will be explained with reference to the drawings. However, the present invention is not limited to the following description, and it is easily understood by those skilled in the art that the modes and details of the present invention can be changed in various ways without departing from the spirit and the scope of the present invention. Therefore, the present invention should not be interpreted as being limited to the description of the embodiments to be given below.

Embodiment 1

Embodiment 1 will describe a storage device according to one embodiment of the present invention.

Figure 1:
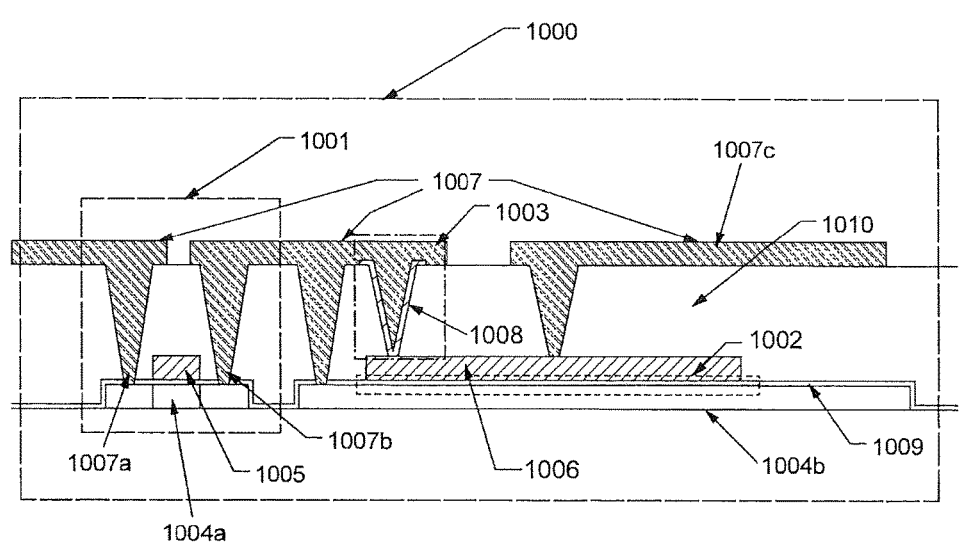
FIG. 1 is a cross-sectional view of the inside of a memory cell according to one embodiment of the present invention.

FIG. 1 is a cross-sectional view of the inside of a memory cell. The memory cell 1000 includes a selection transistor 1001, an assist capacitor 1002, and a memory element 1003. The selection transistor 1001 includes an active layer 1004*a*, an insulating film 1009, and an electrode 1005 (a gate electrode 1005). Electrodes 1007*a*, 1007*b* (source and drain electrodes 1007*a*, 1007*b*) are electrically connected to source and drain regions of the active layer 1004*a*. The assist capacitor 1002 includes an active layer 1004*b*, the insulating film 1009, and an electrode 1006, and the memory element 1003 includes an electrode 1007*c*, an electrode 1006, and a semiconductor film 1008.

As illustrated in FIG. 1, a terminal of the selection transistor 1001, a terminal of the assist capacitor 1002, and a terminal of the memory element 1003 are electrically connected. The electrode 1006 is used in common for one terminal of the assist capacitor 1002 and one terminal of the memory element 1003, and is connected to a cathode (a power line) by the electrode 1007*c*. In addition, the difference between the resistance before short circuiting and the resistance after the short circuiting of a memory element according to one embodiment of the present invention is about $10^6$. It is 100 MΩ or more as a general value, preferably 1 GΩ or more. In addition, the resistance after the short circuiting is 10 KΩ or less, preferably 1 KΩ or less. As just described, the difference between the resistance before the short circuiting and the resistance after the short circuiting is about $10^6$.

The principle of writing in a memory will be described.

The electrode 1007*a*, a terminal of the selection transistor 1001, is electrically connected to a bit line electrode, and the electrode 1005 is electrically connected to a word line, and thereby an element which is address-selected is turned ON. When the selection transistor 1001 is turned ON, the electrode 1007*b* of the memory element 1003 is given a high potential, and the electrode 1006 thereof is given a ground potential from the cathode. Thus, a voltage or a current is applied to electrodes of the memory element 1003, and when the application amount exceeds a certain level of voltage or a certain amount of current, the electrodes are short-circuited. The assist capacitor 1002 stores charges when the selection transistor 1001 is turned ON, and facilitates a writing state by supplying charges stored in the assist capacitor 1002 into the memory element 1003 at the moment of short circuiting of the memory element 1003. Further, when the assist capacitor 1002 has a MOS structure and an impurity added to the active layer is a p-type impurity, yield in writing is increased and the reliability is improved.

A difference from a conventional structure will be described below.

Figure 2:
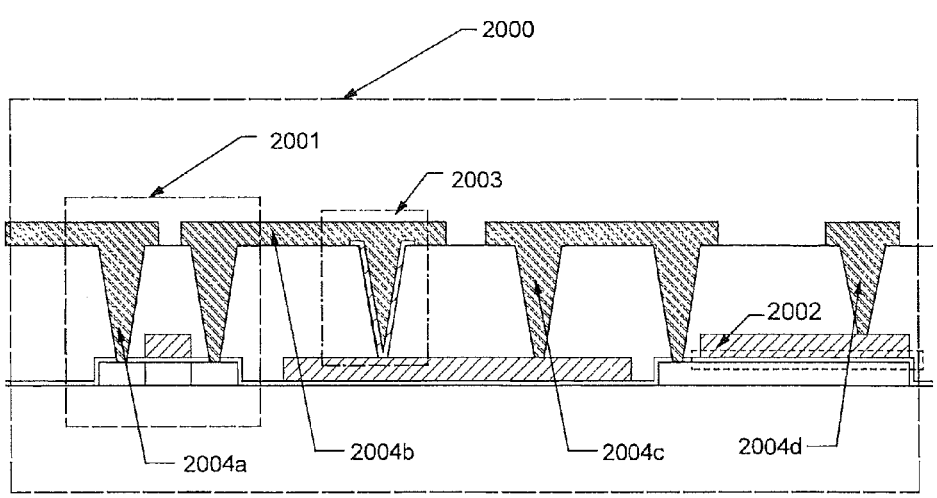
FIG. 2 is a cross-sectional view of the inside of a conventional memory cell.

FIG. 2 illustrates a conventional example of a memory cell including a selection transistor, an assist capacitor, and a memory element. In a memory cell 2000, a selection transistor 2001, an assist capacitor 2002, and a memory element 2003 are independently arranged, and are electrically connected by electrodes 2004*a* to 2004*d*. Although not illustrated, the electrode 2004*b* and the electrode 2004*d* are electrically connected. Unlike in the conventional example, in one embodiment of the present invention, the electrode of the assist capacitor 1002 and the electrode of the memory element are the common electrode 1006, and the memory element 1003 is stacked over the assist capacitor 1002.

In addition, as for materials of parts of the structure illustrated in FIG. 1, the active layers 1004*a* and 1004*b* are each formed from a polysilicon film or an amorphous silicon film; the electrode 1005, the electrode 1006, and the electrode 1007 are each formed from a metal film having high conductivity such as tungsten, aluminum, or titanium; the semiconductor film 1008 (the film between electrodes of the memory element) is formed with a stacked structure of an amorphous silicon film and a silicon oxynitride (SiON) film;

the GI film 1009 (a gate insulating film and an insulating film forming a capacitor) is formed with an insulating film of an inorganic material such as silicon oxide ($SiO_2$); and the same can be applied to the insulating film used for the assist capacitor. An interlayer insulating film 1010 is formed with an insulating film of an inorganic material such as silicon oxynitride (SiON), silicon nitride oxide (SiNO), or silicon oxide ($SiO_2$) or an organic material such as polyimide (PI). In particular, the electrode 1006 (i.e., a metal used for the cathode) of the memory element is preferably tungsten, because writing efficiency is increased and the reliability is improved.

Figure 3:
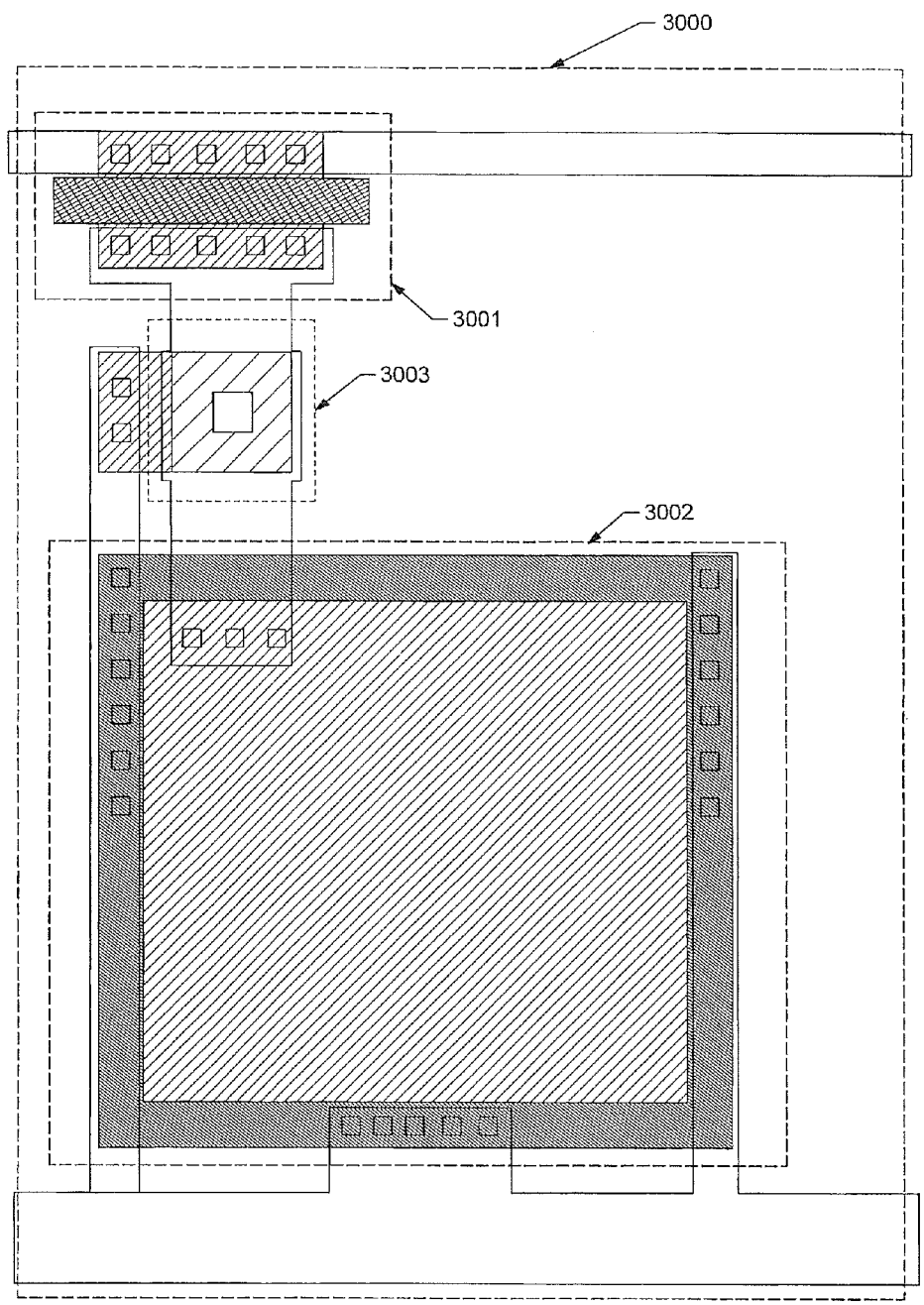
FIG. 3 is a top view of the inside of a conventional memory cell.
Figure 4:
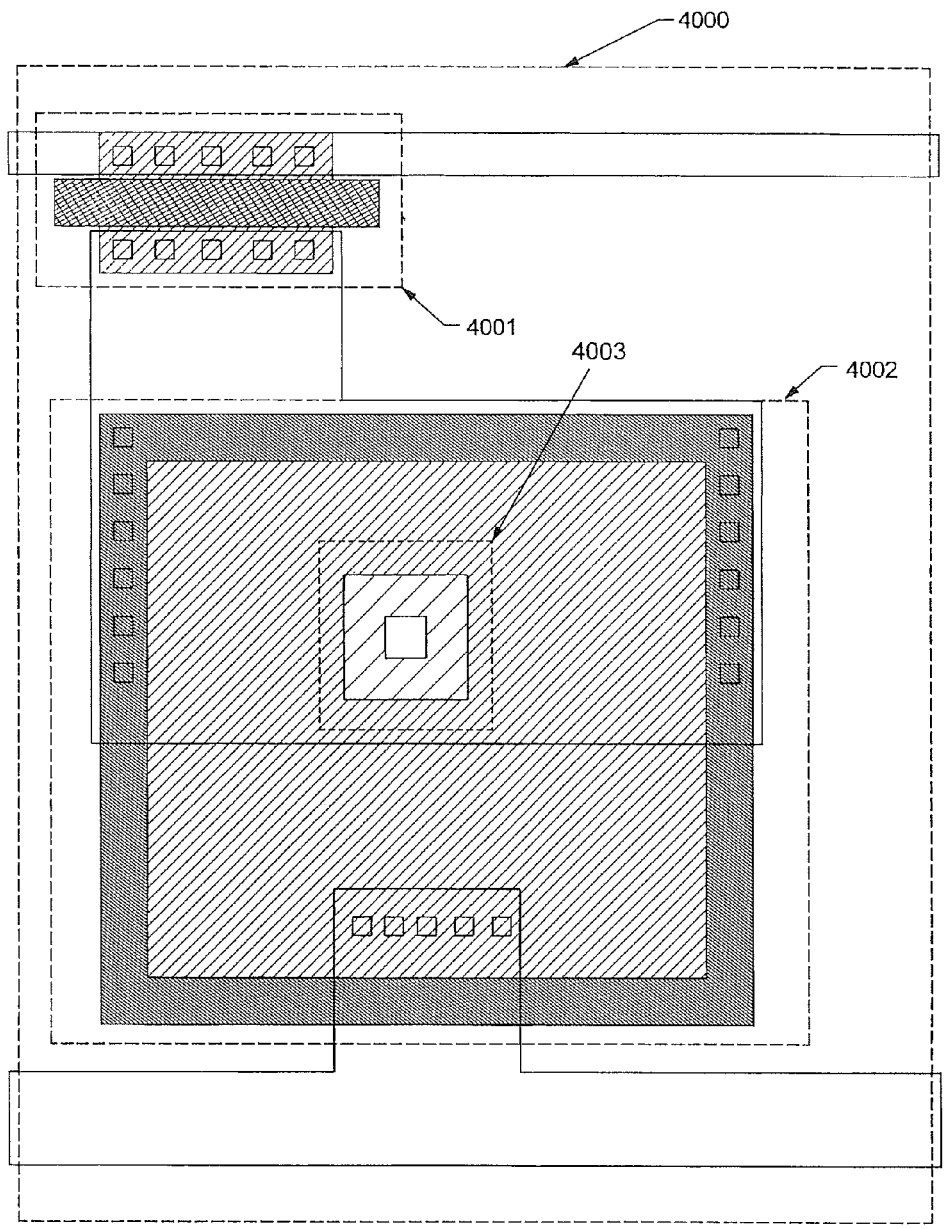
FIG. 4 is a top view of the inside of a memory cell according to one embodiment of the present invention.

FIG. 3 is a top view of a conventional memory cell, while FIG. 4 is a top view of a memory cell according to one embodiment of the present invention.

In FIG. 3, reference numeral 3000 denotes a whole memory cell; 3001, a selection transistor; 3002, an assist capacitor; and 3003, a memory element. In FIG. 4, similarly to FIG. 3, reference numeral 4000 denotes a whole memory cell; 4001, a selection transistor; 4002, an assist capacitor; and 4003, a memory element.

In one embodiment of the present invention, one electrode of the assist capacitor 4002 and one electrode of the memory element 4003 are common, and the memory element 4003 is disposed over the electrode of the assist capacitor 4002, and thus the area of the memory cell can be down-sized as compared with the conventional memories.

Embodiment 2

Embodiment 2 will describe an applicable combination of a semiconductor device and an assist capacitor according to one embodiment of the present invention.

In addition, materials of an active layer, a GI film, an insulating film, and a metal film described below are the same as those described in Embodiment 1.

Figure 5:
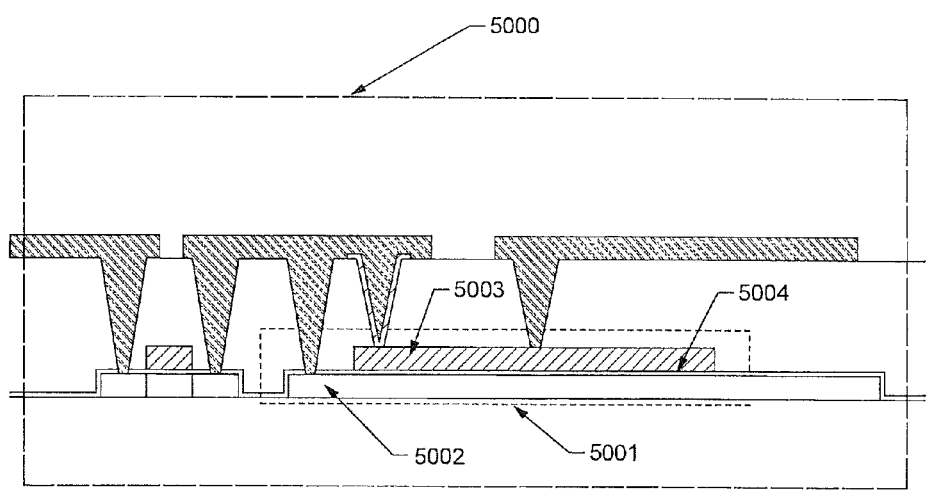
FIG. 5 is a cross-sectional view of a stacked structure of an assist capacitor having a MOS structure according to one embodiment of the present invention.

FIG. 5 is a cross-sectional view of a stacked structure of an assist capacitor having a MOS structure.

In FIG. 5, reference numeral 5000 denotes a whole memory cell, in which an assist capacitor 5001 has a MOS structure where a GI film 5004 (between an active layer 5002 and a metal film 5003) serves as a capacitor. As described above, in the capacitor having the MOS structure, the active layer is doped with an n-type or p-type impurity so that it can serve as a capacitor. Yield in writing can be increased by doping the active layer with a p-type impurity.

Figure 6:
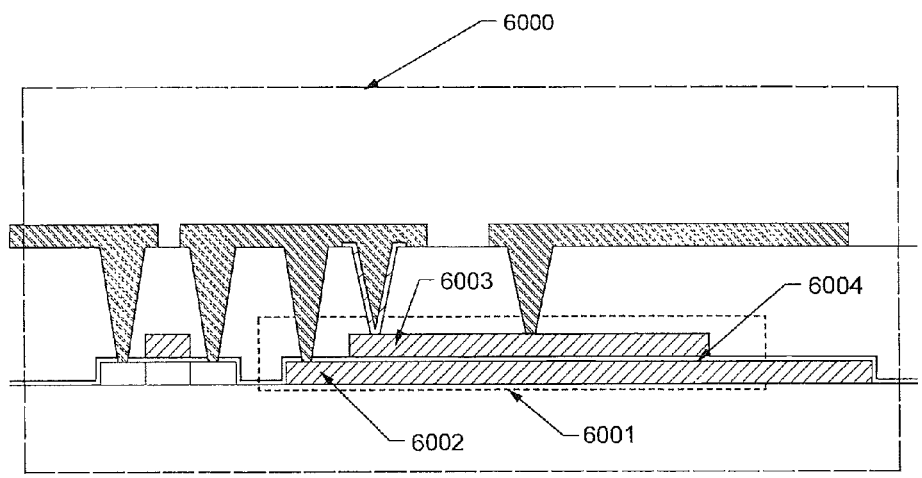
FIG. 6 is a cross-sectional view of a stacked structure of an assist capacitor having a MIM structure according to one embodiment of the present invention.

FIG. 6 is a cross-sectional view of a stacked structure of an assist capacitor having a MIM (metal-insulator-metal) structure.

In FIG. 6, reference numeral 6000 denotes a whole memory cell, in which an assist capacitor 6001 has a MIM structure where an insulating film 6004 (between a metal film 6002 and a metal film 6003) serves as a capacitor.

Figure 7:
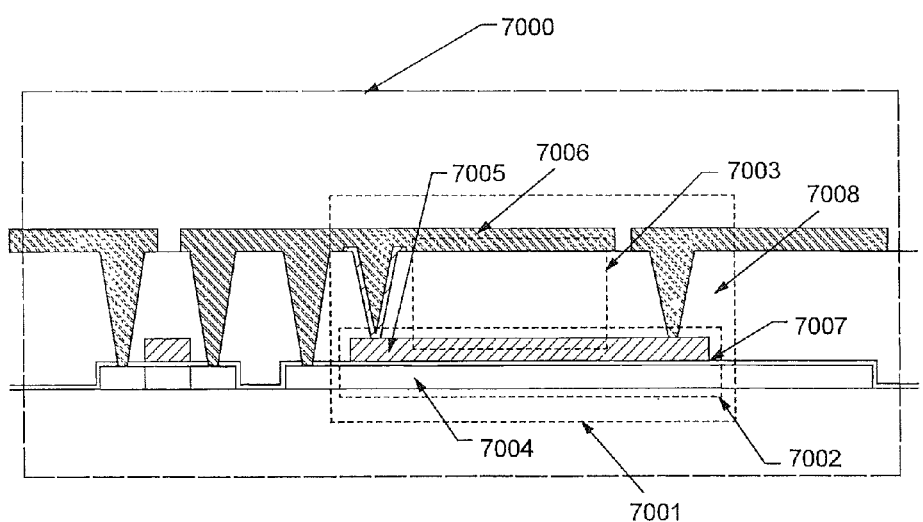
FIG. 7 is a cross-sectional view of a stacked structure of an assist capacitor having a combination of a MOS structure and a MIM structure according to one embodiment of the present invention.

FIG. 7 is a cross-sectional view of a stacked structure of an assist capacitor having a combination of a MOS structure and a MIM structure.

In FIG. 7, reference numeral 7000 denotes a whole memory cell, in which an assist capacitor 7001 has a combination of a MOS structure 7002 and a MIM structure 7003. In the MOS structure, a GI film 7007 (between an active layer 7004 and a metal film 7005) serves as a capacitor, and in the MEM structure, an insulating film 7008 (between the metal film 7005 and a common electrode 7006) serves as a capacitor. The MOS structure and the MIM structure are combined. In a case where the insulating film 7008 includes plural films, part of the films included in the insulating film 7008 is etched to be thin and the thinned part of the insulating film 7008 serves as a capacitor, which is effective.

Embodiment 3

Embodiment 3 will describe a more specific structure of a storage device according to one embodiment of the present invention, with reference to a drawing.

Figure 8:
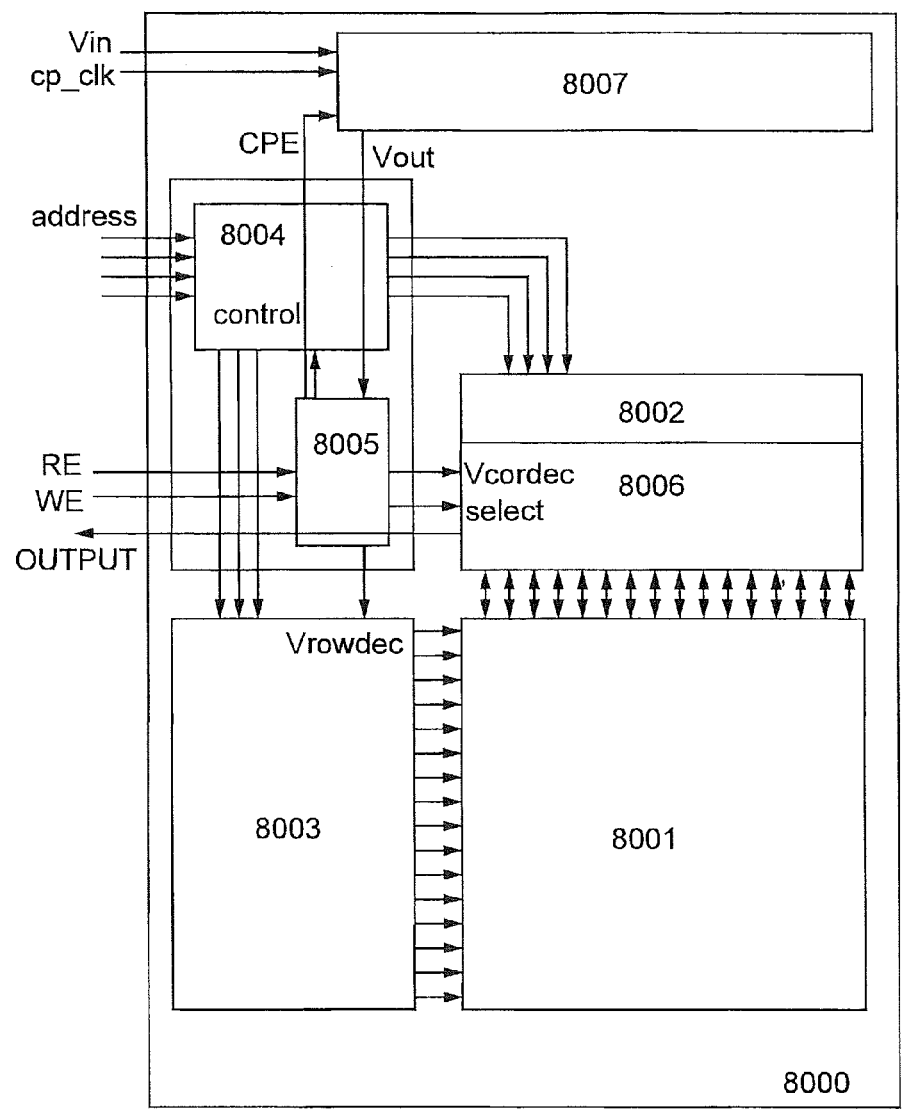
FIG. 8 illustrates modules of a memory cell and circuits for driving the memory cell.

FIG. 8 is a block diagram illustrating modules of a memory cell and circuits for driving the memory cell. A memory circuit 8000 includes a memory cell array 8001, a column decoder 8002, a row decoder 8003, an address selector 8004, a selector 8005, a reading/writing circuit 8006, and a booster circuit 8007. In the memory cell array 8001, n×m pieces of memory cells 100 described in Embodiment 1 are arranged in matrix.

Operation of the memory circuit is described. To the memory circuit 8000, operational signals of a read-enable (RE) signal, a write-enable (WE) signal, an address signal, a booster clock signal (cp_clk, charge pump clock signal) are input, and a booster input voltage Vin is applied as power. Although not illustrated, power for driving the circuit, such as VDD and GND, are also applied as power source for operation.

RE and WE are input to the selector 8005 and the operation of the memory is determined. As an example, reading operation is conducted when RE is active but WE is non-active, writing operation is conducted when WE is active but RE is non-active, and standby state is made when WE and RE are both non-active.

In the case of writing operation, it is also possible that a booster-enable signal (CPE, charge pump enable signal) is produced, which is a condition for operation of the booster circuit. In this manner, increase in consumption current due to unnecessary boosting can be suppressed. In addition, a control signal is produced in the wiring operation or the reading operation, and is input to the address selector, and thereby improper operation due to driving of the decoder in the standby state is prevented.

An address signal is divided via the address selector 8004, and the divided signal is input to the column decoder 8002 and the row decoder 8003. The column decoder 8002 and the row decoder 8003 each include a plurality of decoders, and one of the decoders included each decoder is driven by a combination of values of the address signal. Then, by a combination of the driven decoders, one memory cell for writing or reading is determined. As described above, in a state where neither writing nor reading is conducted, a signal input to the decoder is made non-active by a control signal produced by the selector, so that the decoder is not selected.

The reading/writing circuit 8006 connected to the column decoder 8002 drives either the reading circuit or the writing circuit inside in response to a select signal produced by the selector 8005. In this case, the writing circuit may be driven in a writing state, or the reading circuit may be driven in a reading state. The reading circuit reads data 0 or data 1 from a state of the memory cell which the reading circuit have accessed, and outputs it as data output (OUTPUT).

The booster circuit 8007 operates in response to cp_clk as an input signal from the outside when CPE produced by the selector 8005 is active, amplifies power Vin applied from the outside, and outputs it as Vout. The structure of the booster circuit 8007 may be a generally-known structure. Vout is input to the selector 8005, and the selector 8005 supplies it as power (Vcoldec) for the column decoder 8002 and power (Vrowdec) for the row decoder 8003 in the writing operation.

One embodiment of the present invention can be applied to the memory cell constituting the memory cell array 8001. According to one embodiment of the present invention, the area of the memory cell array 8001 can be reduced, and as a result, the area of the memory circuit 8000 can be reduced. The effect becomes more advantageous as the number of memory cells constituting the memory cell array 8001 is larger, in other words, the number of the memory capacitors is larger.

Embodiment 4

In this embodiment, a semiconductor device which has a storage device according to one embodiment of the present invention is described.

A semiconductor device in this embodiment includes a memory circuit, stores information which is necessary for the memory circuit, and exchanges information with the outside by using contactless means, for example, wireless communication. With this feature, the semiconductor device in this embodiment has an application for an individual authentication system in which individual information of an object or the like is stored and the object is recognized by reading the information, for example. In order to use the semiconductor device in this embodiment for such an application, higher reliability is necessary because data on individual information is stored to recognize an object, for example.

Figure 9:
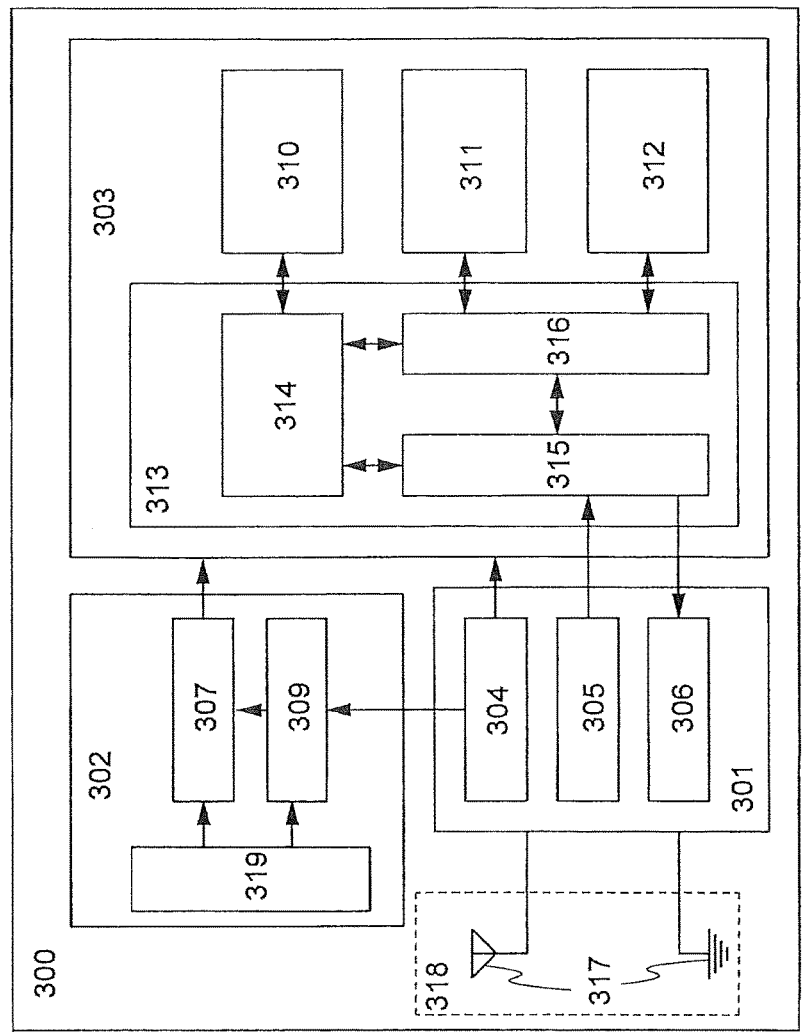
FIG. 9 is a block diagram illustrating a structure of a semiconductor device according to one embodiment of the present invention.

The structure of the semiconductor device in this embodiment is described with reference to FIG. 9. FIG. 9 is a block diagram illustrating the structure of the semiconductor device in this embodiment.

As illustrated in FIG. 9, a semiconductor device 300 includes a RF circuit 301, a clock generation circuit 302, a logic circuit 303, and an antenna 317 in an antenna portion 318. Note that although not illustrated in FIG. 9, the semiconductor device 300 transmits and receives wireless signals to and from an external circuit such as a wireless communication device through the antenna 317. Note that data transmission methods are roughly classified into the following three methods: an electromagnetic coupling method, in which a pair of coils is arranged so as to be opposite to each other and communication is performed by mutual induction, an electromagnetic induction method, in which communication is performed using an induction field, and an electromagnetic wave method, in which communication is performed using an electromagnetic wave. Any of these methods can be used in this embodiment.

Next, the structure of each circuit is described. The RF circuit 301 includes a power supply circuit 304, a demodulation circuit 305, and a modulation circuit 306. In addition, the clock generation circuit 302 includes a frequency division circuit 307, a counter circuit 309, and a reference clock generation circuit 319. Further, the logic circuit 303 has a function of performing arithmetic processing, and includes a controller 313, a CPU (also referred to as a central processing unit) 310, a ROM (read only memory) 311, and a RAM (random access memory) 312.

In addition, the controller 313 includes a CPU interface 314, an RF interface 315, and a memory controller 316.

Further, in the RF circuit 301, the power supply circuit 304 includes a rectifier circuit and a storage capacitor, and has a function of generating power supply voltage from a received signal and supplying the power supply voltage to other circuits. The demodulation circuit 305 includes a rectifier circuit and an LPF (low-pass filter) and has a function of extracting a command or data from a communication signal. The modulation circuit 306 has a function of modulating transmission data, and modulated data is transmitted as a transmitted signal from the antenna 317.

Next, the operation of the semiconductor device in this embodiment is described. First, a signal transmitted from an external communication device is received by the semiconductor device. The received signal which is input to the semiconductor device is demodulated by the demodulation circuit 305 and then input to the RF interface 315 in the controller 313. The received signal which is input to the RF interface 315 is subjected to arithmetic processing by the CPU 310 through the CPU interface 314. In addition, with the received signal which is input to the RF interface 315, access to the ROM 311 and the RAM 312 is performed through the memory controller 316.

Then, transmission data is generated after arithmetic processing is performed by the CPU 310 and data in the ROM 311 and the RAM 312 is input and output, the transmission data is modulated as a signal by the modulation circuit 306 and is transmitted from the antenna 317 to the external communication device.

In this embodiment, the storage device according to one embodiment of the present invention can be mounted as the ROM 311 or the RAM 312 of the semiconductor device, or another memory circuit. When the storage device according to one embodiment of the present invention is mounted, a more down-sized semiconductor device can be provided. Further, since the storage device according to one embodiment of the present invention can be manufactured at low cost, manufacturing cost of the semiconductor device can be reduced. Moreover, a chip-integration type antenna in which parts of from the element portion to the antenna are integrated is formed, and thereby the cost can be reduced.

Note that this embodiment can be combined with any of the other embodiments as appropriate.

Embodiment 5

In Embodiment 5, a method for manufacturing a semiconductor device which has a storage device according to one embodiment of the present invention is described.

Figure 10A:
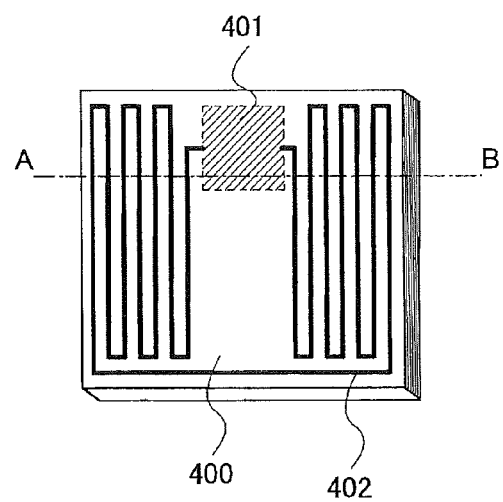
FIGS. 10A and 10B are a schematic view and a cross-sectional view of a semiconductor device according to one embodiment of the present invention, respectively.

A semiconductor device of this embodiment is described with reference to FIGS. 10A and 10B. FIG. 10A is a schematic view illustrating the structure of the semiconductor device of this embodiment, and FIG. 10B is a cross-sectional view thereof.

As illustrated in FIG. 10A, the semiconductor device in this embodiment includes a substrate 400, an element portion 401 which is provided over the substrate 400, and an antenna 402 which is electrically connected to the element portion 401.

The element portion 401 includes a plurality of elements such as storage devices and has a function of processing a signal received from the outside. The antenna 402 has a function of transmitting data in the semiconductor device.

Figure 10B:
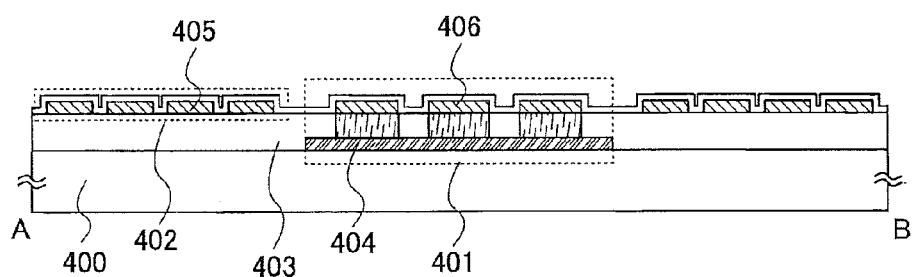

Further, as illustrated in FIG. 10B, the semiconductor device in this embodiment includes an element 404 which is provided over the substrate 400, an interlayer film 403 which is provided over the element 404 and the substrate 400, a conductive layer 405 which is provided over the interlayer film 403 and functions as the antenna 402, a conductive layer 406 which is electrically connected to the element 404, and the element portion 401 which has the conductive layer 406 electrically connected to the element 404.

In addition, the conductive layer 405 which functions as the antenna 402 is provided in the same layer as the conductive layer 406 in the structure of FIG. 10B, but this is not a limiting example. A structure can also be used in which, after the element portion 401 is provided, an insulating film is separately provided so as to cover the element portion and the conductive layer 405 is provided over the insulating film.

Figure 11A:
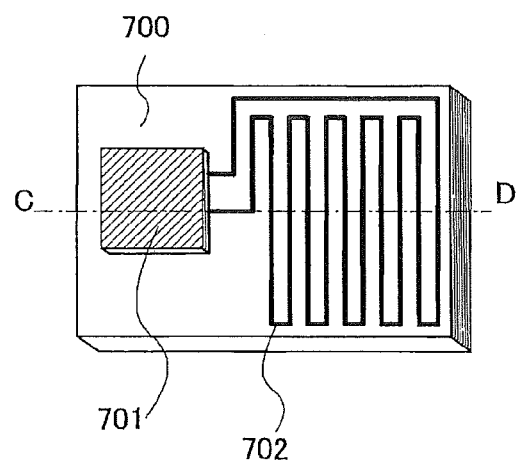
FIGS. 11A and 11B are a schematic view and a cross-sectional view of another semiconductor device according to one embodiment of the present invention, respectively.

Furthermore, the semiconductor device of this embodiment is not limited to the structure of FIGS. 10A and 10B. Another structural example of the semiconductor device of this embodiment is described with reference to FIGS. 11A and 11B. FIG. 11A is a schematic view illustrating another structure of the semiconductor device of this embodiment, and FIG. 11B is a cross-sectional view thereof.

As illustrated in FIG. 11A, the semiconductor device in this embodiment includes the substrate 700, the element portion 701 which is provided over the substrate 700, and the antenna 702 which is electrically connected to the element portion 701.

In a manner similar to that of the structures of FIGS. 10A and 10B, the element portion 701 includes a plurality of elements 704 such as memory elements and has a function of processing a signal received from the outside. The antenna 702 has a function of transmitting data in the semiconductor device.

Figure 11B:
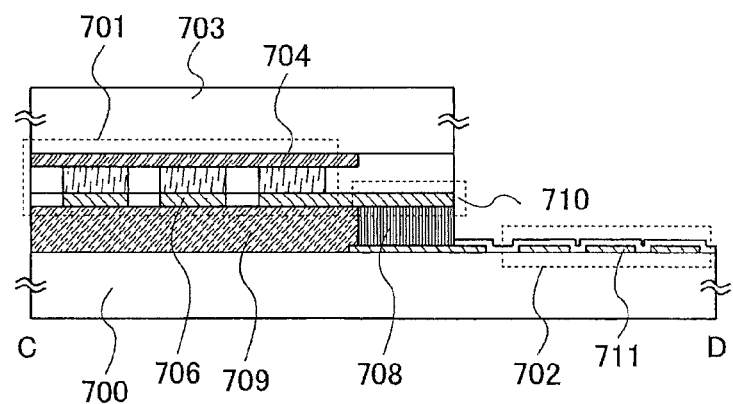

Further, as illustrated in FIG. 11B, the semiconductor device in this embodiment includes the substrate 700, a conductive layer 711 which serves as the antenna 702 and a resin 709, which are provided over part of the substrate 700, a conductive particle 708 which is provided over part of the conductive layer 711, a conductive layer 706 which is provided over part of the resin 709 and part of the conductive particle 708, the element portion 701 which is provided over the conductive layer 706, and a substrate 703 which is provided over the element portion 701.

In the structure of FIGS. 11A and 11B, a terminal portion 710 is provided and the conductive layer which is provided in the same layer as the conductive layer 706 is used as the terminal portion 710. In addition, the substrate 703 which is provided with the element portion 701 and the terminal portion 710, and the substrate 700 which is provided with the antenna 702 are attached so as to make an electrical connection with the terminal portion 710.

In this embodiment, the storage device according to one embodiment of the present invention can be used as a storage device in the element portion 401. When the storage device according to one embodiment of the present invention is used, a semiconductor device having high reliability can be manufactured at low cost.

When a plurality of the element portions 401 or a plurality of the element portions 701 are formed over a large substrate in advance and then cut into separate sections, the element portion 401 or 701 can be formed at low cost. As each of the substrates 400, 700 and the substrate 703 used in this case, a flexible substrate formed using polyethylene terephthalate (PET), polyethylene naphthalate (PEN), polyether sulfone (PES), acrylic, or the like can be used as a plastic substrate.

A plurality of transistors, a storage device, and the like which are included in the element portion 401 or 701 are not limited to being provided in the same layer, and can be provided in a plurality of layers. When the element portion 401 or 701 is provided in a plurality of layers, an interlayer insulating film is used. As a material of the interlayer insulating film, a resin material such as an epoxy resin or an acrylic resin, a light-transmitting resin material such as a polyimide resin, a compound material which includes a siloxane material such as a siloxane resin, a material which contains a water-soluble homopolymer and a water-soluble copolymer, or an inorganic material can be used. Further, a stacked-layer structure of plural kinds of the above-described materials can be used. A siloxane material corresponds to a material having a Si—O—Si bond. Siloxane has a skeleton structure of a bond of silicon (Si) and oxygen (O). As a substituent, an organic group which contains at least hydrogen (e.g., an alkyl group or aromatic hydrocarbon) is used. A fluoro group may be contained in the organic group. Note that the interlayer insulating film can be formed by CVD, sputtering, an SOG method, a droplet discharge method, a screen printing method, or the like.

Moreover, as a material of the interlayer insulating film, a material with low dielectric constant is preferably used for reducing parasitic capacitance which is generated between the layers. When the parasitic capacitance is reduced, high-speed operation and reduction in power consumption can be realized.

The conductive layer 405, the conductive layer 406 and the conductive layer 706 can be formed by using CVD, sputtering, a printing method such as a screen printing method or a gravure printing method, a droplet discharge method, a dispenser method, a plating method, or the like. The conductive layer 405 the conductive layer 406 and the conductive layer 706 can be formed with a single-layer structure or a stacked-layer structure of an element selected from aluminum, titanium, silver, copper, gold, platinum, nickel, palladium, tantalum, or molybdenum, or an alloy material or compound material which contains any of these elements as its main component.

For example, in the case of forming the conductive layer 405, the conductive layer 406 or the conductive layer 706, the conductive layer 711 by using a screen printing method, the conductive layers can be formed by selectively printing a conductive paste where a conductive particle having a particle size of several nm to several tens μm is dissolved or dispersed in an organic resin. As the conductive particle, metal particles of one or more of silver, gold, copper, nickel, platinum, palladium, tantalum, molybdenum, titanium, and the like, a fine particle of silver halide, or a dispersing nano particle can be used. In addition, as the organic resin included in the conductive paste, one or more selected from organic resins which function as a binder, a solvent, a dispersive agent, and a coating member of the metal particles can be used. Typically, an organic resin such as an epoxy resin or a silicone resin can be used. Further, in forming the conductive layer, baking is preferably performed after the conductive paste is pushed out. For example, in the case of using a fine particle which includes silver as its main component (e.g., a particle size is from 1 nm to 100 nm) as a material for the conductive paste, the conductive layer can be obtained by baking it with temperatures in the range of 150° C. to 300° C. for curing. Alternatively, a fine particle which includes solder or lead-free solder as its main component may be used as a fine particle. In this case, it is preferable to use a fine particle having a particle size of 20 μm or less. When solder or lead-free solder is used, such conductive layers can be formed at low cost.

When the integrated circuit or the like is provided over the element portion 401 or 701, for example, a transistor which includes an active layer formed of a single-layer structure or a stacked layer structure of any of an amorphous semiconductor, a microcrystalline semiconductor (also referred to as a microcrystal semiconductor), a polycrystalline semiconductor, an organic semiconductor, and the like can be used as each of the transistors included in the element portion. In order to obtain a transistor with favorable characteristics, an active layer which is crystallized by using a metal element as a catalyst or an active layer which is crystallized by laser irradiation is preferably used. Alternatively, as an active layer, a semiconductor layer which is formed by plasma CVD by using an $SiH_4/F_2$ gas or an $SiH_4/H_2$ gas (an Ar gas), or a semiconductor layer which is irradiated with laser light can be used.

Further, such transistors included in the element portions 401 or 701 can be formed using a crystalline semiconductor layer (a low temperature polysilicon layer) which is obtained by crystallizing an amorphous semiconductor layer at a temperature of from 200° C. to 600° C. (preferably from 350° C. to 500° C.) or a crystalline semiconductor layer (a high temperature polysilicon layer) which is obtained by crystallization at a temperature of 600° C. or higher. Note that when a high temperature polysilicon layer is formed over a substrate, a quartz substrate is preferably used because a glass substrate is weak to heat in some cases.

Hydrogen or a halogen element is preferably added to the active layers (particularly channel regions) of the transistors included in the element portion 401 or 701 at a concentration of $1 \times 10^{19}$ atoms/cm$^3$ to $1 \times 10^{22}$ atoms/cm$^3$, more preferably a concentration of from $1 \times 10^{19}$ atoms/cm$^3$ to $5 \times 10^{20}$ atoms/cm$^3$. Thus, active layers with few defects, in which cracks are not easily generated, can be obtained.

Further, it is preferable to provide a barrier film which blocks contaminant such as an alkali metal so as to wrap the transistors included in the element portion 401 or 701 or the element portion 401 or 701. Thus, the element portion 401 or 701, which is not contaminated and has higher reliability, can be provided. Note that a silicon nitride film, a silicon nitride oxide film, a silicon oxynitride film, or the like can be used as the barrier film. Further, the thickness of each of the active layers of the transistors included in the element portion 401 or 701 is from 20 nm to 200 nm, preferably from 40 nm to 170 nm, more preferably from 45 nm to 55 nm or from 145 nm to 155 nm, and still more preferably 50 nm or 150 nm. Thus, the element portion 401 or 701, in which cracks are not easily generated even in the case of being bent, can be provided.

Further, preferably, crystals which are included in the active layers of the transistors included in the element portion 401 or 701 are formed so as to have a crystal boundary extending in parallel to a direction where carries flow (a channel length direction). Such an active layer is formed using a continuous wave laser, or a pulsed laser which is operated at a frequency of 10 MHz higher, preferably from 60 MHz to 100 MHz.

Furthermore, such transistors included in the element portion 401 or 701 preferably have characteristics of a subthreshold swing of 0.35 V/dec lower (preferably from 0.09 V/dec to 0.25 V/dec), and a mobility of 10 cm$^2$/Vs or higher. Such characteristics can be realized when each of the active layers is formed by using a continuous wave laser or a pulsed laser which is operated at a frequency of 10 MHz or higher.

Moreover, the transistors included in the element portion 401 or 701 have frequency characteristics of 1 MHz or higher, preferably 10 MHz or higher (at 3 to 5 V) at the ring oscillator level. Alternatively, the transistors included in the element portion 401 or 701 have frequency characteristics of 100 kHz or higher, preferably 1 MHz or higher (at 3 to 5 V) per gate.

Figure 12A:
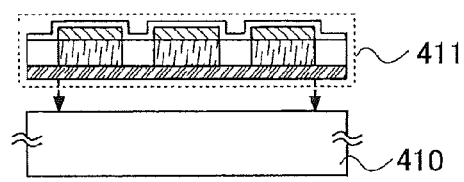
FIGS. 12A to 12C schematically illustrate a structure and a manufacturing method of another semiconductor device according to one embodiment of the present invention.
Figure 12B:
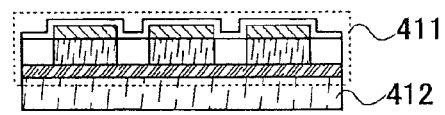

The substrate over which the element portion is formed can be used itself, which is not a limiting example. FIGS. 12A and 12B show an example where a substrate which is different from the substrate over which the element portion is formed is used. FIGS. 12A and 12B are schematic views illustrating another structure and another method for manufacturing the semiconductor device in this embodiment.

As illustrated in FIG. 12A, in a substrate 410 over which an element portion 411 is formed, the element portion 411 over the substrate 410 is separated. Further, as illustrated in FIG. 12B, the separated element portion 411 can be attached to a substrate 413, which is different from the substrate 410. Note that as the substrate 413, a flexible substrate or the like can be used, for example.

The element portion 411 can be separated from the substrate 410 by any of the following methods: a method in which a metal oxide film is provided between the substrate 410 with high heat resistance and the element portion 411 and the metal oxide film is crystallized to be weakened so that the element portion 411 is separated; a method in which an amorphous silicon film containing hydrogen is provided between the substrate 410 with high heat resistance and the element portion 411 and the amorphous silicon film is removed by laser light irradiation or etching so that the element portion 411 is separated; a method in which the substrate 410 of high heat resistance, over which the element portion 411 is formed, is removed mechanically or by etching with a solution or a gas such as $CF_3$ so that the element portion 411 is separated; and the like.

Alternatively, instead of the above-described methods, a metal film (formed using tungsten, molybdenum, titanium, tantalum, or cobalt, for example) which functions as a separation layer, or a metal oxide film (formed using tungsten oxide, molybdenum oxide, titanium oxide, tantalum oxide, cobalt oxide, a stacked-layer structure of a metal film and a metal oxide film, for example) is provided between the substrate 410 and the element portion 411, and the element portion 411 can be separated from the substrate 410 by using physical means. Alternatively, after an opening portion is formed as selected to expose the separation layer, part of the separation layer is removed with an etching agent such as halogen fluoride (e.g., $ClF_3$), and then, the element portion 411 can be separated from the substrate 410 physically.

Further, the separated element portion 411 may be attached to the substrate 413 by using a commercialized adhesive, for example, an adhesive such as an epoxy resin-based adhesive or a resin additive.

Figure 12C:
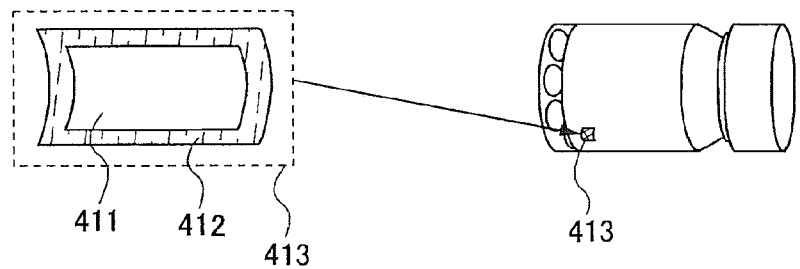

When the element portion 411 is attached to the substrate 413 so that the semiconductor device is manufactured as described above, a semiconductor device which is thin, lightweight, and is not easily broken even when it is dropped can be provided. Further, since a flexible substrate is used as the substrate 413, the substrate 413 can be attached to a curved surface or an irregular shape and various applications are realized. For example, as illustrated in FIG. 12C, a semiconductor device 414 according to one embodiment of the present invention can be tightly attached to a curved surface of a medicine bottle, for example. Moreover, when the substrate 410 is reused, a semiconductor device can be provided at lower cost.

Note that this embodiment can be combined with any of the other embodiments as appropriate.

Embodiment 6

In Embodiment 6, a case where a flexible semiconductor device is manufactured by using a separation process is described.

Figure 13A:
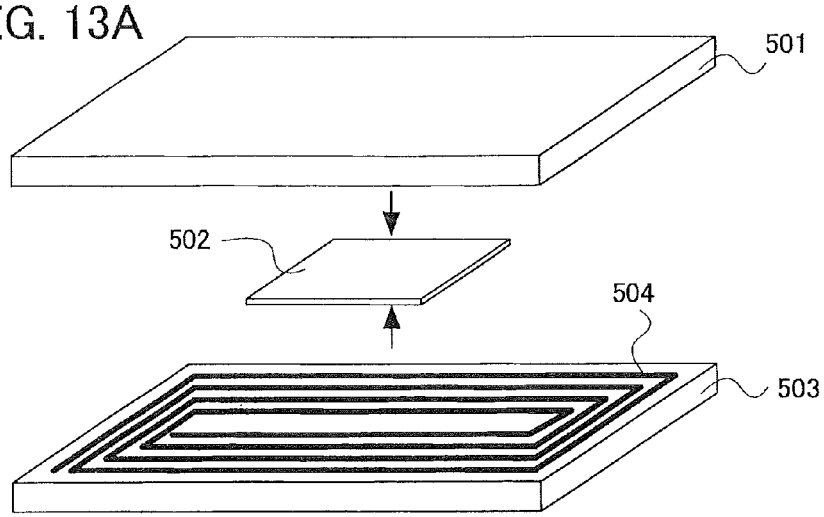
FIGS. 13A to 13C are views illustrating a structure of a semiconductor device according to one embodiment of the present invention.
Figure 13B:
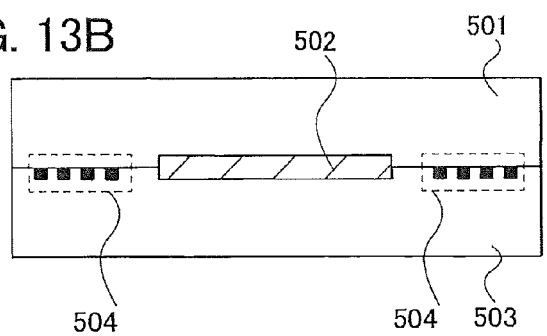
Figure 13C:
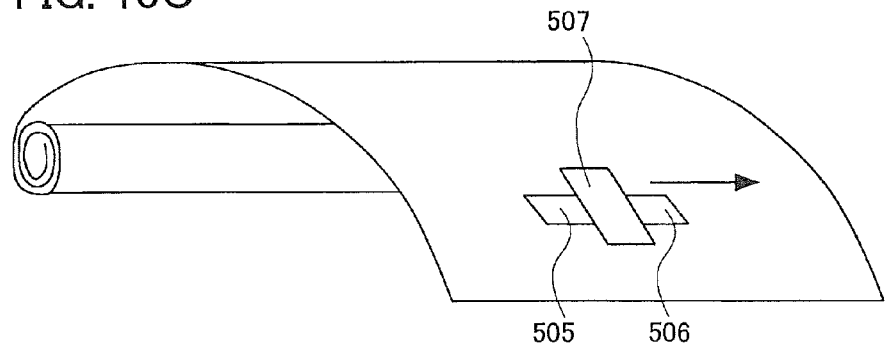

A method for manufacturing a semiconductor device in this embodiment is described with reference to FIGS. 13A to 13C. FIGS. 13A to 13C are top views illustrating the structure of the semiconductor device in this embodiment.

As illustrated in FIG. 13A, the semiconductor device in this embodiment includes a flexible protective layer 501, a flexible protective layer 503 having an antenna 504, and an element portion 502 which is formed through a separation process. The antenna 504 which is formed over the protective layer 503 is electrically connected to the element portion 502. The antenna 504 is formed only over the protective layer 503 in the structure illustrated in FIG. 13A, but this is not a limiting example. The antenna 504 can also be provided for the protective layer 501. In addition, when a barrier film formed of a silicon nitride film or the like is formed between the element portion 502, and the protective layers 501 and 503, a semiconductor device having higher reliability can be provided, without contamination of the element portion 502.

For a conductive layer which functions as the antenna 504, any of the materials described in Embodiment 4 can be used. In addition, the element portion 502 and the antenna 504 are connected to each other by UV treatment or ultrasonic cleaning with an anisotropic conductive film, but this method is not a limiting example. The element portion 502 and the antenna 504 can be connected to each other by various methods.

As illustrated in FIG. 13B, the thickness of the element portion 502 which is interposed between the protective layers 501 and 503 is preferably 5 µm or smaller, more preferably from 0.1 µm to 3 µm. In addition, when the thickness of the protective layers 501 and 503 which are superposed is denoted by d, the thickness of the protective layers 501 and 503 is preferably (d/2)±30 µm, more preferably (d/2)±10 Further, the thickness of the protective layers 501 and 503 is preferably from 10 µm to 200 µm. Furthermore, the area of the element portion 502 is 5 mm×5 mm (25 mm$^2$) or smaller, preferably from 0.3 mm×0.3 mm (0.09 mm$^2$) to 4 mm×4 mm (16 mm$^2$).

Since the protective layers 501 and 503 are formed using organic resin materials, the protective layers 501 and 503 have high resistance against bending. Further, the element portion 502 itself which is formed through the separation process has higher resistance against bending than a single-crystal semiconductor. Since the element portion 502 can be tightly attached to the protective layers 501 and 503 without any space therebetween, the completed semiconductor device itself has high resistance against bending. The element portion 502 which is surrounded by the protective layers 501 and 503 may be provided over a surface of or inside another object, or may be embedded in paper.

Next, a case where the element portion which is formed through the separation process is attached to a substrate having a curved surface is described.

As illustrated in FIG. 13C, one transistor which is selected from the element portion formed through the separation process is linear in a direction where current flows (as shown by an arrow). That is, a drain electrode 505, a gate electrode 507, and a source electrode 506 are located linearly. In addition, the direction where current flows and a direction where a substrate draws an arc are arranged to be perpendicular to each other. With such arrangement, even when the substrate is bent to draw an arc, the influence of stress is small, and variation in characteristics of transistors included in the element portion can be suppressed.

Further, when the ratio of the area of an active region (a silicon island portion) of an active element such as a transistor to the whole area of the substrate is 1% to 50% (preferably 1% to 30%), damage of the element due to stress can be prevented.

In a region where an active element is not provided, a base insulating material, an interlayer insulating film material, and a wiring material are mainly provided. The ratio of the area of the region other than the active region such as a transistor to the whole area of the substrate is 60% or more. Thus, a semiconductor device which can be easily bent and has a high integration degree can be provided. Moreover, a chip-integration type antenna in which parts of from the element portion to the antenna are integrated is formed, and thereby the cost can be, reduced.

When a semiconductor device which has a storage device according to one embodiment of the present invention is manufactured using the method for manufacturing the semiconductor device in this embodiment as described above, the semiconductor device can be manufactured even over a curved surface and the application range of the semiconductor device can be made wider.

Note that this embodiment can be combined with any of the other embodiments as appropriate.

Embodiment 7

In Embodiment 7, application examples of a semiconductor device which has any of the storage devices of the aforementioned embodiments are described.

Application examples of a semiconductor device which has any of the storage devices of the aforementioned embodiments are described with reference to FIGS. 14A to 14F. FIGS. 14A to 14F are schematic views illustrating usage examples of a semiconductor device according to one embodiment of the present invention.

Figure 14A:
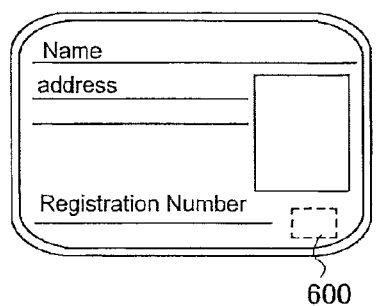
FIGS. 14A to 14F schematically illustrate application examples of a semiconductor device according to one embodiment of the present invention.
Figure 14B:
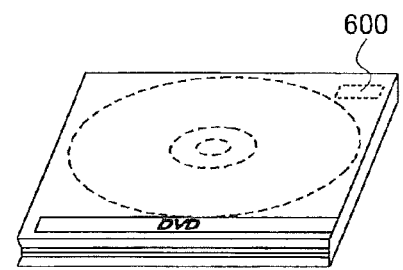
Figure 14C:
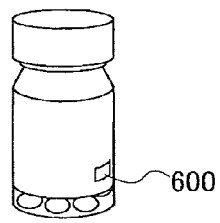
Figure 14D:
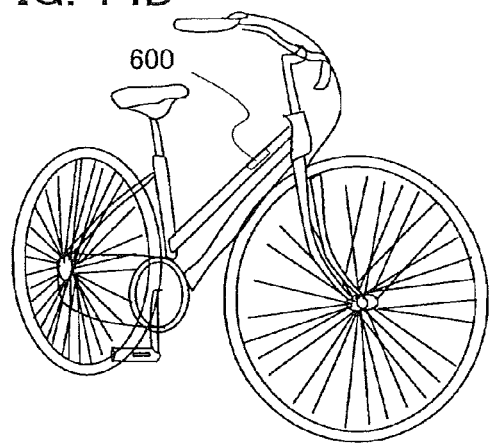
Figure 14E:
Figure 14F:
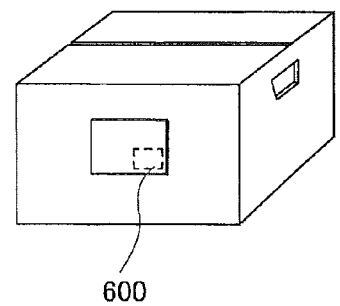

As illustrated in FIGS. 14A to 14F, the semiconductor device can be used widely and can be used by being provided for, for example, bills, coins, securities, bearer bonds, certificates (e.g., driver's licenses or resident cards, see FIG. 14A), or objects such as containers for wrapping (e.g., wrapping paper or bottles, see FIG. 14C), recording media (e.g., DVDs or video tapes, see FIG. 14B), vehicles (e.g., bicycles, see FIG. 14D), personal belongings (e.g., bags or glasses), foods, plants, animals, human bodies, clothes, livingwares, or electronic devices (e.g., liquid crystal display devices, EL display devices, television sets, or mobile phones), or shipping tags of the objects (see FIGS. 14E and 14F).

A semiconductor device 600 according to one embodiment of the present invention is fixed to an object by being mounted on a printed board, attached to a surface, or embedded therein. For example, the semiconductor device is fixed to an object by being embedded in a paper of a book or an organic resin of a package. Since the semiconductor device 600 according to one embodiment of the present invention achieves reduction in size, thickness, and weight, an attractive design of the object itself is not spoiled even after the semiconductor device 600 according to one embodiment of the present invention is fixed to the object. In addition, when the semiconductor device 600 according to one embodiment of the present invention is provided for bills, coins, securities, bearer bonds, certificates, or the like, a certification function can be provided, and forgery thereof can be prevented by utilizing the certification function. Further, when the semiconductor device according to one embodiment of the present invention is attached to containers for wrapping, recording media, personal belongings, foods, clothes, livingwares, electronic devices, or the like, a system such as an inspection system can be efficiently used. Furthermore, when the semiconductor device according to one embodiment of the present invention is attached to vehicles, safety against theft or the like can be increased.

When a semiconductor device which has the storage device according to one embodiment of the present invention is used for application usage described in this embodiment in this manner, data which is used for exchanging information can be maintained at an accurate value. Therefore, authenticity or security of an object can be increased.

Example 1

Example 1 will describe a manufacturing method of a semiconductor device including an anti-fuse type semiconductor storage device with reference to FIGS. 15A to 15E, FIGS. 16A to 16E, FIGS. 17A to 17E, FIGS. 18A to 18C, and FIGS. 19A to 19D. An example of manufacturing a semiconductor device in which a logic circuit portion 1550, a semiconductor memory circuit portion 1552, and an antenna portion 1554 are provided over the same substrate, is described here. A circuit including thin film transistors is integrated in the logic circuit portion 1550. A semiconductor memory circuit portion 1552 includes a memory cell including a plurality of thin film transistors and an anti-fuse type memory element. Note that for convenience, cross sectional views illustrating two thin film transistors included in the logic circuit portion 1550, one thin film transistor and one memory element which are included in the semiconductor memory circuit portion 1552, and one capacitor and one thin film transistor included in the antenna portion are illustrated in the drawings. Note that each element illustrated in the cross-sectional views in Example 1 is illustrated with an exaggerated scale in order to describe the cross-sectional structures clearly.

Note that the term "semiconductor device" in Example 1 means a device which can be operated by utilizing semiconductor properties.

First, a metal layer 1502 that serves as a separation layer is formed over a support substrate 1501. A glass substrate is used as the support substrate 1501. As the metal layer 1502, a tungsten layer, a tungsten nitride layer or a molybdenum layer with a thickness of 30 nm to 200 nm which is obtained by a sputtering method is used.

Next, a surface of the metal layer 1502 is oxidized to form a metal oxide layer. The metal oxide layer may be formed by oxidation of the surface of the metal layer 1502 with pure water or ozone water, or oxidation of the surface of the metal layer 1502 with oxygen plasma. Alternatively, the metal oxide layer may be formed by heating in an atmosphere containing oxygen. Further alternatively, the metal oxide layer may be formed in a later step of forming an insulating layer serving as a separation layer which is formed over the metal layer 1502. For example, when a silicon oxide layer or a silicon oxynitride layer is formed as the insulating layer by a plasma CVD method, the surface of the metal layer 1502 is oxidized, so that the metal oxide layer is formed. Note that the metal oxide layer is not illustrated in the drawing. Further, a base insulating layer such as a silicon oxide layer or a silicon nitride layer may be provided between the separation layer (here, the metal layer 1502) and the substrate. In a stacked structure of Example 1, a silicon oxynitride layer with a thickness of 100 nm is used as the base insulating layer, a tungsten layer with a thickness of 30 nm is used as the meta layer, and a silicon oxide layer with a thickness of 200 nm is used as the first insulating layer (FIG. 15A).

Next, a first insulating layer 1503 is formed over the metal layer 1502. An insulating layer such as a silicon oxide layer, a silicon nitride layer, or a silicon oxynitride layer is formed as the first insulating layer 1503. As an example of the first insulating layer 1503, a two-layer structure can be given in which a silicon nitride oxide layer having a thickness of 50 nm to 100 nm which is formed by a plasma CVD method using $SiH_4$, $NH_3$, and $N_2O$ as reactive gases, and a silicon oxynitride layer having a thickness of 100 nm to 150 nm which is formed by a plasma CVD method using $SiH_4$ and $N_2O$ as reactive gases are stacked. When the first insulating layer 1503 has a stacked-layer structure, as at least one layer of the first insulating layer 1503, a silicon nitride layer or a silicon oxynitride layer having a thickness of 10 nm or smaller is preferably formed. Alternatively, a three-layer structure may be employed in which a silicon nitride oxide layer, a silicon oxynitride layer, and a silicon nitride layer are sequentially stacked. Although the first insulating layer 1503 serves as a base insulating layer, it is not provided if it is not particularly needed. In Example 1, a stacked structure of a 50-nm-thick silicon nitride oxide layer and a 100-nm-thick silicon oxynitride layer is used as the first insulating layer (FIG. 15B).

Next, a semiconductor layer 1570 is formed over the first insulating layer 1503. The semiconductor layer 1570 is formed as follows: a semiconductor layer having an amorphous structure is formed by a CVD method such as an LPCVD method or a plasma CVD method, or a sputtering method, and then crystallized to obtain a crystalline semiconductor layer, and the crystalline semiconductor layer is selectively etched into a desired shape. As a crystallization method, a laser crystallization method, a thermal crystallization method using RTA or an annealing furnace, a crystallization method using a metal element, such as nickel, which promotes crystallization, or the like can be used. Note that when the semiconductor layer is formed by a plasma CVD method, the first insulating layer 1503 and the semiconductor layer having an amorphous structure can be successively formed without exposure to air. The semiconductor layer is formed to a thickness of 25 nm to 80 nm (preferably 30 nm to 70 nm). Although there is no particular limitation on a material of the semiconductor layer, silicon, a silicon germanium, or the like is preferably used.

Alternatively, for crystallization treatment of the semiconductor layer having an amorphous structure, a continuous wave laser can be used. In order to obtain a crystal with a large grain size in crystallization of the semiconductor layer having an amorphous structure, it is preferable to employ second to fourth harmonics of a solid laser capable of continuous wave oscillation. As a typical example, the second harmonic (532 nm) or the third harmonic (355 nm) of an $Nd:YVO_4$ laser (fundamental wave of 1064 nm) may be applied. In the case of using the continuous wave laser, a laser beam emitted from a continuous wave $YVO_4$ laser having an output of 10 W is converted into a harmonics by a non-linear optical element. The harmonics can also be obtained by putting a $YVO_4$ crystal and a non-linear optical element in a resonator. It is preferable to shape the laser beam into a rectangular or elliptical laser beam on an irradiation surface by an optical system and then deliver the laser beam to an object. At this time, an energy density of approximately 0.01 $MW/cm^2$ to 100 $MW/cm^2$ (preferably, 0.1 $MW/cm^2$ to 10 $MW/cm^2$) is needed. Then, the semiconductor layer may be moved at a speed of approximately 10 cm/sec to 2000 cm/sec relatively to the laser beam so as to be irradiated. In Example 1, amorphous silicon with a thickness of 66 nm is stacked over the first insulating layer and is irradiated with laser light to be crystallized (FIG. 15C).

Note that if necessary, a small amount of an impurity element (boron or phosphorus) is added to the semiconductor layer in order to control a threshold value of a thin film transistor to be completed later. In Example 1, boron is added by an ion doping method in which diborane ($B_2H_6$) is excited by plasma without mass separation (FIG. 15D).

The semiconductor layer 1570 is selectively etched to form semiconductor layers 1571 to 1576 having desired shapes (FIG. 15E). Further, an impurity element may be additionally added to a semiconductor layer in a region to serve as an n-channel transistor at a low concentration to form a channel formation region therein. In Example 1, boron is added, with a semiconductor layer in a region to serve as a p-channel transistor covered with a resist mask 1577 (FIG. 16A).

Next, the surface of the semiconductor layer is washed at the same time as removal of an oxide film on the surface of the semiconductor layer with an etchant containing hydrofluoric acid. Then, a second insulating layer 1578 which covers the semiconductor layer is formed. The second insulating layer 1578 is formed to a thickness of 1 nm to 200 nm by a CVD method or a sputtering method. Preferably, a single layer structure or a stacked layer structure including an insulating layer containing silicon having a thickness of 10 nm to 50 nm is formed, and then surface nitridation treatment is performed using plasma excited by a microwave. The second insulating layer 1578 serves as a gate insulating layer (GI film) of the thin film transistor to be formed later. In Example 1, a silicon oxynitride layer having a thickness of 10 nm is formed as the second insulating layer 1578 (FIG. 16B).

In addition, in order that the semiconductor layers (1574, 1575) in a region to become a capacitor later can function as conductors, an impurity element (boron or phosphorus) is added to the semiconductor layer at a high concentration. In this case, a region to serve as an assist capacitor in the memory cell is preferably doped with an impurity element imparting a p-type conductivity. Note that the region other than the region to serve as the capacitor may be covered with resist masks 1579 to 1581 (FIG. 16C).

Next, a gate electrode 1504, a gate electrode 1505, a gate electrode 1506, a gate electrode 1507, a capacitor electrode 1508 and a first electrode 1509 serving as a lower electrode of a memory element are formed over the second insulating layer. A conductive layer having a thickness of 100 nm to 500 nm which is obtained by a sputtering method is selectively etched and processed into a desired shape, so that the gate electrodes 1504 to 1507, the capacitor electrode 1508 and the first electrode 1509 are obtained.

As a material of the gate electrodes 1504 to 1507 and the first electrode 1509, a substance such as tungsten, titanium, aluminum, nickel, chromium, molybdenum, tantalum, cobalt, zirconium, vanadium, palladium, hafnium, platinum, or iron; a single layer structure or a stacked layer structure of a material selected from an alloy thereof or a compound thereof can be used. A material which reacts with silicon to form a silicide is preferably used. Note that a high melting point metal is preferably used as the gate electrode of the thin film transistor. Specifically, tungsten or molybdenum can be given. In the case where the gate electrodes 1504 to 1507 and the first electrode 1509 each have a stacked-layer structure, a material layer which serves as an upper layer may be formed using the above-described material, and a material layer which serves as a lower layer on the gate insulating layer side may be a polysilicon layer to which an impurity element such as phosphorus is added. In addition, since the first electrode 1509 is used for an electrode of the anti fuse in contact with amorphous silicon, a material which is reacted with silicon is preferably used. In Example 1, a stacked structure of a 30-nm-thick tantalum nitride and a 370-nm-thick tungsten is used (FIG. 16D).

Next, resist masks 1582 to 1584 are formed so as to cover the region to be a p-channel transistor and regions to be a capacitor, and an impurity element is added into the semiconductor layers in regions to be n-channel transistors, using the gate electrodes 1505, 1506, and 1507 as masks, so that low-concentration impurity regions are formed. As an impurity element, an impurity element imparting an n-type conductivity or an impurity element imparting a p-type conductivity can be used. As an n-type impurity element, phosphorus (P), arsenic (As), or the like can be used. In Example 1, phosphorus is added into the semiconductor layers in the regions to be the n-channel transistors so as to be contained at concentrations of $1\times10^{15}/cm^3$ to $1\times10^{19}/cm^3$, so that n-type impurity regions are formed (FIG. 16E).

Next, the resist masks are removed, and then resist masks 1585 to 1587 are formed so as to cover the semiconductor layer to be the n-channel transistor and the regions to be a capacitor, and an impurity element is added into the semiconductor layer to be the p-channel transistor, using the gate electrode 1504 as s mask, so that p-type impurity regions are formed. As the impurity element imparting p-type conductivity, boron (B), aluminum (Al), gallium (Ga), or the like can be used. Here, boron (B) is added into the semiconductor layer in the region to be the p-channel transistor so as to be contained at concentrations of $1\times10^{19}/cm^3$ to $1\times10^{20}/cm^3$, so that the p-type impurity region can be formed. As a result, a channel formation region 1516 and a pair of p-type impurity regions 1514 are formed in the semiconductor layer to serve as the p-channel transistor in a self alignment manner. The p-type impurity region 1514 serves as a source region or a drain region. In a similar manner, p-type impurity regions 1515, 1517 having different impurity concentrations are formed in the semiconductor layers to be a capacitor in a self alignment manner (FIG. 17A).

Next, sidewall insulating layers 1510 are formed on side surfaces of the gate electrodes 1504 to 1507 and sidewall insulating layers 1511 are formed on side surfaces of the first electrode 1509. A formation method of the sidewall insulating layers 1510 and 1511 is as follows: first, a third insulating layer 1588 is formed to have a single-layer structure or a stacked-layer structure of a layer containing silicon, an oxide of silicon, or a nitride of silicon, or a layer containing an organic material such as an organic resin by a plasma CVD method, a sputtering method, or the like so as to cover the second insulating layer, the gate electrodes 1504 to 1507, the capacitor electrode 1508, and the first electrode 1509. In Example 1, a stacked structure of a 100-nm-thick silicon oxynitride layer and a 200-nm-thick LTO is used (FIG. 17B). Then, the third insulating layer 1588 is selectively etched by anisotropic etching in which etching is performed mainly in a perpendicular direction, and thereby insulating layers (sidewall insulating layers 1510 and sidewall insulating layers 1511) are formed so as to be in contact with side faces of the gate electrodes 1504 to 1507, the capacitor electrode 1508, and the first electrode 1509. Note that part of the second insulating layer 1578 is removed by being etched at the same time as the formation of the sidewall insulating layers 1510. The part of the second insulating layer 1578 is removed, so that a gate insulating layer 1512 is formed under each of the gate electrodes 1504 to 1507 and the sidewall insulating layers 1510. In addition, the part of the second insulating layer is removed, so that insulating layers 1513 are formed under the capacitor electrode 1508, the first electrode 1509 and the sidewall insulating layers 1511 (FIG. 17C).

Next, resist masks 1589 to 1591 are formed so as to cover the semiconductor layer in the region to be the p-channel transistor, and an impurity element is added into the semiconductor layers in the regions to be the n-channel transistors, using the gate electrodes 1505, 1506, and 1507 and the sidewall insulating layers 1510 as masks, so that high-concentration impurity regions are formed. The resist masks are removed after the impurity element is added. In Example 1, phosphorus (P) is added into the semiconductor layers in the regions to be the n-channel transistors so as to be contained at concentrations of $1\times10^{19}/cm^3$ to $1\times10^{20}/cm^3$, so that n-type high-concentration impurity regions and n-type impurity regions can be formed. As a result, in each of semiconductor layers in the region to serve as the n-channel transistors, a channel formation region 1520, a pair of low concentration impurity regions 1519 serving as LDD regions, and a pair of high concentration impurity regions 1518 serving as a source region and a drain region are formed in a self alignment manner. Note that the low concentration impurity regions 1519 serving as LDD regions are formed under the sidewall insulating layer 1510 (FIG. 17D).

Note that the structure is described in which the LDD regions are formed in the semiconductor layer included in the n-channel thin film transistor and the LDD regions are not formed in the semiconductor layer included in the p-channel thin film transistor, but this is not a limiting example. The LDD regions may be formed in the semiconductor layers included in both the n-channel thin film transistor and the p-channel thin film transistor. In particular, when a gate insulating layer (GI film) is thin, specifically, when the thickness of the gate insulating layer is 10 nm or smaller, an LDD structure is preferably employed in order to increase the withstand voltage of the p-channel transistor.

Next, after formation of a fourth insulating layer 1522 including hydrogen by a sputtering method, an LPCVD method, a plasma CVD method, or the like, hydrogenation treatment and activation treatment of the impurity element added into the semiconductor layer are performed. Heat treatment (at a temperature of 300° C. to 550° C. for 1 to 12 hours) in a furnace or an RTA method using a lamp light source is used for the hydrogenation treatment and the activation treatment of the impurity element. For example, a silicon oxynitride layer which is obtained by a plasma CVD method is used for the fourth insulating layer 1522 containing hydrogen. Here, a thickness of the fourth insulating layer 1522 containing hydrogen is set to from 50 nm to 200 nm. Besides, in a case where the semiconductor layer is crystallized using a metal element which promotes crystallization, typically nickel, gettering which reduces nickel in the channel formation region can also be performed at the same time as the activation. Note that the fourth insulating layer 1522 containing hydrogen is a first layer of an interlayer insulating layer. In Example 1, silicon oxynitride with a thickness of 50 nm is stacked as the fourth insulating layer and subjected to heat treatment at 550° C. for four hours as the hydrogenation treatment and the activation treatment of the impurity element (FIG. 17E).

Then, a fifth insulating layer 1523 is formed as a second layer of the interlayer insulating layer by a sputtering method, an LPCVD method, a plasma CVD method, or the like. An insulating layer in a single layer or stacked layers such as a silicon oxide layer, a silicon nitride layer, and/or a silicon oxynitride layer is used as the fifth insulating layer 1523. Here, the thickness of the fifth insulating layer 1523 is 300 nm to 800 nm. In Example 1, a stacked structure of a 100-nm-thick silicon nitride oxide and a 600-nm-thick silicon oxynitride is formed as the fifth insulating layer 1523 and subjected to heat treatment at 410° C. for one hour (FIG. 18A).

Next, a resist mask is formed over the fifth insulating layer 1523 and the fourth insulating layer 1522 and the fifth insulating layer 1523 are selectively etched, so that a first opening 1521 which reaches the first electrode 1509 is formed. The resist mask is removed after the etching. A diameter of the first opening 1521 may be about 1 μm to 6 μm. In Example 1, the diameter of the first opening 1521 is 2 μm (FIG. 18B).

Next, a layer used as a memory element, that is, a stacked layer of a silicon oxynitride layer and an amorphous silicon layer is formed using a sputtering method, an LPCVD method, a plasma CVD method, or the like. In Example 1, an amorphous silicon layer having a thickness of 15 nm and a silicon oxynitride layer having a thickness of 6 nm are formed in order by a plasma CVD method. Then, a resist mask is formed and the amorphous silicon layer and the silicon oxynitride layer are selectively etched, so that a stacked layer 1524 of the amorphous silicon layer and the silicon oxynitride layer, which overlaps with the first opening 1521, is formed. The stacked layer 1524 of the amorphous silicon layer and the silicon oxynitride layer serves as a resistant material layer of the memory element. The resist mask is removed after the etching (FIG. 18C).

Next, a resist mask is formed and the fourth insulating layer 1522 and the fifth insulating layer 1523 are selectively etched, so that contact holes 1592a to 1592j that reach the semiconductor layers, contact holes 1593a to 1593e that reach the gate electrodes, and a second opening 1594 that reaches the first electrode 1509 are formed. The resist mask is removed after the etching (FIG. 19A).

Next, oxide films formed on exposed surfaces of the semiconductor layers and on an exposed surface of the first electrode 1509 are removed with an etchant containing hydrofluoric acid, and at the same time, the exposed surfaces of the semiconductor layers and the exposed surface of the first electrode 1509 are washed.

Next, a conductive layer is formed by a sputtering method to form an upper electrode of the memory element, the source and drain electrodes and the like of the thin film transistors, and the like. This conductive layer is formed in a single layer or stacked layers of a substance such as tungsten, titanium, aluminum, nickel, chromium, molybdenum, tantalum, cobalt, zirconium, vanadium, palladium, hafnium, platinum, or iron, or an alloy or a compound thereof. Further, this conductive layer is also used for the source and drain electrodes of the thin film transistors. Therefore, it is preferable to use a material which has relatively low contact resistance with the semiconductor layers of the thin film transistors. For example, a three-layer structure of a titanium layer, an aluminum layer containing a minute amount of silicon, and a titanium layer or a three-layer structure of a titanium layer, an aluminum alloy layer containing nickel and carbon, and a titanium layer is employed. In Example 1, a three-layer structure of a 100 nm thick titanium layer, a 350 nm thick pure aluminum layer, and a 100 nm thick titanium layer is employed. Further, Example 1 shows the example in which a tungsten layer is used as a material of the lower electrode of the memory element and a titanium layer is used as a material of the upper electrode. However, the materials are not particularly limited as long as they can change the state of the resistance material layer from a high resistance state to a low resistance state and the same material may be used for the upper electrode and the lower electrode of the memory element. When the lower electrode and the upper electrode of the memory element are formed using the same material, they are formed to have a single layer structure or a stacked-layer structure of a material which is selected from a substance such as tungsten, titanium, aluminum, nickel, chromium, molybdenum, tantalum, cobalt, zirconium, vanadium, palladium, hafnium, platinum, or iron, an alloy material or a compound material thereof.

Next, a resist mask is formed, and a conductive layer is selectively etched to form a conductive layer 1525, a conductive layer 1526, a conductive layer 1527, a conductive layer 1528, a conductive layer 1531, a conductive layer 1532 each serving as a source electrode or a drain electrode, a wiring 1529 serving as a bit line of a selection transistor, a wiring 1530 serving as a word line, a wiring 1535, a wiring 1536, a wiring 1537 each serving as a gate lead wiring, a second electrode 1540 and a third electrode 1541 of the semiconductor memory circuit portion, a wiring 1533 and a wiring 1534 each serving as an electrode of the capacitor of the antenna portion, and a fourth electrode 1542 of the antenna portion. The second electrode 1540 overlaps with the first opening 1521 and serves as an upper electrode of the memory element, and is electrically connected to the semiconductor layer 1574 which serves as one terminal of the electrode of the assist capacitor. In addition, the third electrode 1541 overlaps with the second opening 1594 to be electrically connected to the first electrode 1509. Note that the fourth electrode 1542 is electrically connected to thin film transistors of the antenna portion and the power supply portion, though the connection is not illustrated here. Then, the resist mask is removed after the etching (FIG. 19B).

In Example 1, a thin film transistor of the logic circuit portion 1550, a thin film transistor 1558 to serve as a selection transistor of the semiconductor memory circuit portion 1552, an assist capacitor 1559, a memory element 1560, and a thin film transistor of the antenna portion 1554 are formed over the same substrate. In Example 1, a cross-sectional view of the p-channel transistor and the n-channel transistor provided in the logic circuit portion 1550, the thin film transistor 1558 provided in the semiconductor memory circuit portion 1552, the assist capacitor 1559, the memory element 1560, the capacitor and the n-channel transistor provided in the antenna portion 1554, is illustrated. Note that the present invention is not limited to this example and the thin film transistor provided in the semiconductor memory circuit portion 1552 may be a p-channel thin film transistor. Further, a p-channel thin film transistor may be provided in the antenna portion 1554. Here, one n-channel thin film transistor is illustrated for convenience.

Next, a sixth insulating layer 1543 is formed to cover the thin film transistor of the logic circuit portion 1550, the thin film transistor and the memory element of the semiconductor memory circuit portion 1552, and the thin film transistor of the antenna portion 1554. An insulating layer containing silicon oxide or an insulating layer formed using an organic resin can be used as the sixth insulating layer 1543. The insulating layer containing silicon oxide is preferably used to improve reliability of the semiconductor device. Alternatively, an insulating layer containing an organic resin formed by a coating method is preferably used because the sixth insulating layer 1543 preferably has a planarized surface in a case where an antenna to be formed later is formed by a screen printing method. The material for forming the sixth insulating layer 1543 may be selected by a practitioner as appropriate. Further, the antenna to be formed later may be formed so as to reach a region which overlaps with the logic circuit portion 1550 and the semiconductor memory circuit portion 1552. In this case, the sixth insulating layer 1543 also functions as an interlayer insulating layer for insulation from the antenna. In a case where the antenna has a circular shape (for example, a loop antenna) or a spiral shape, one of both ends of the antenna is led by a wiring of a lower layer; thus, it is preferable to provide the sixth insulating layer 1543. However, in a case where a microwave method is employed and the antenna has a linear shape (for example, a dipole antenna), a flat shape (for example, a patch antenna), or the like, the antenna to be formed later can be arranged so as not to overlap with the logic circuit portion and the semiconductor memory circuit portion; thus, the sixth insulating layer 1543 is not necessarily provided.

Next, a resist mask is formed, and the sixth insulating layer 1543 is selectively etched, so that a third opening 1595 that reaches the third electrode 1541 and a fourth opening 1596 that reaches the fourth electrode 1542 are formed. The resist mask is removed after the etching (FIG. 19C).

Next, a metal layer is formed over the sixth insulating layer 1543. As the metal layer, a single layer or a stack layer selected from Ti, Ni and/or Au can be used. Then, a resist mask is formed, and the metal layer is selectively etched, so that a lead wiring 1544 for the first electrode 1509 is formed and a base layer 1545 for the antenna is formed. Note that the lead wiring 1544 and the base layer 1545 here can be selectively formed by a sputtering method using a metal mask without using the resist mask, as well. When the base layer 1545 for the antenna is provided, a large contact area with the antenna can be secured. In addition, the lead wiring 1544 is not necessarily formed depending on a layout of a circuit design. The lead wiring 1544 is connected, as a cathode, to a ground power source.

Next, an antenna 1546 is formed over the base layer 1545 for the antenna. The antenna 1546 can be formed by such a method in which a metal layer of Al, Ag, or the like is formed by a sputtering method and then is selectively etched into a desired shape. Alternatively, the antenna 1546 can be formed by a screen printing method. A screen printing method refers to a method in which an ink or a paste, which is provided on a screen plate formed in such a manner that a predetermined pattern is formed from a photosensitive resin on a base made of a metal mesh or a high molecular compound fiber mesh, is transferred to a work which is placed on the opposite side of the screen plate, with use of a rubber, plastic, or metal blade which is called a squeegee. A screen printing method has a merit that pattern formation in a relatively large area is realized at low cost (FIG. 19D).

In Example 1, the thin film transistor of the logic circuit portion 1550 and the thin film transistor and the memory element of the semiconductor memory circuit portion 1552, and the thin film transistor and the antenna of the antenna portion 1554 are formed over the same substrate.

Next, the metal layer 1502 and the support substrate 1501 are removed by separation. Separation can occur inside the metal oxide layer, at an interface between the first insulating layer 1503 and the metal oxide layer, or an interface between the metal oxide layer and the metal layer 1502, so that a portion which is above the first insulating layer 1503 and which will serve as the semiconductor device can be separated from the support substrate 1501 with relatively little force. When the metal layer 1502 and the support substrate 1501 are removed, a fixing substrate may be attached to the side where the antenna is provided.

Next, one sheet in which a plurality of semiconductor devices are formed is divided to plural semiconductor devices by a cutter, dicing, or the like. In addition, with use of a method in which each semiconductor device is picked up and separated, this dividing step is not needed.

Then, the semiconductor devices are fixed to a sheet base. For the sheet base, plastic, paper, a prepreg, a ceramic sheet, or the like can be used. The semiconductor devices may be fixed so as to be interposed between two sheet bases, or may be fixed to one sheet base with an adhesive layer. For the adhesive layer, various curable adhesives such as a reactive curable adhesive, a thermosetting adhesive, or a photo curable adhesive such as an ultraviolet cure adhesive, or an anaerobic adhesive can be used. In addition, the semiconductor devices are disposed in formation of paper, so that the semiconductor devices can be provided inside one piece of paper.

The memory of the semiconductor device formed through the above steps is constituted by a semiconductor storage device according to one embodiment of the present invention. According to one embodiment of the present invention, the memory element 1560 is stacked directly on the assist capacitor 1559 with the first electrode 1509 used as the common electrode for the assist capacitor 1559 and the memory element 1560, and thereby the occupation area is reduced. The semiconductor device including a semiconductor storage device according to one embodiment of the present invention can be down-sized. In addition, the logic circuit portion 1550, the semiconductor memory circuit portion 1552, and the antenna portion 1554 are formed over the same substrate, and thereby improper operation in writing or reading data can be reduced.

Example 2

In Example 2, as for a storage device according to one embodiment of the present invention, a difference in yield of writing based on polarities of assist capacitors having a MOS structure is described with reference to FIG. 20.

An N-type assist capacitor is referred to as "A structure", while a P-type assist capacitor is referred to as "B structure". A voltage (about 8 V) necessary for writing is applied to each memory element, and the percentage of success in writing for one time writing is obtained as "yield of writing". The capacitance values of the assist capacitors "A structure" and "B structure" are 1 pF and 0.4 pF respectively. The comparison result is shown in FIG. 20.

Figure 20:
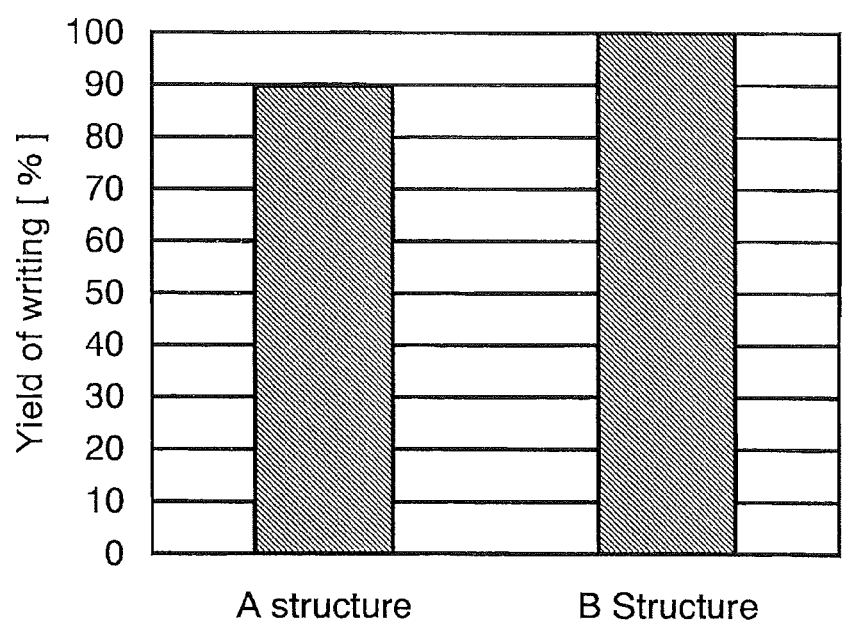
FIG. 20 shows a difference in yield of writing based on polarities of an assist having a MOS structure according to one embodiment of the present invention.
Figure 21A:
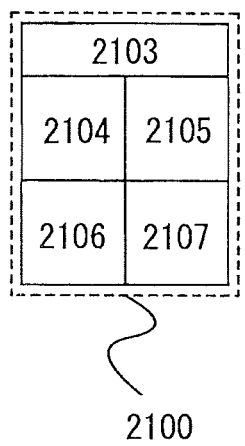
FIGS. 21A to 21C schematically illustrate conventional cases where the occupation area of a memory cell is increased.
Figure 21B:
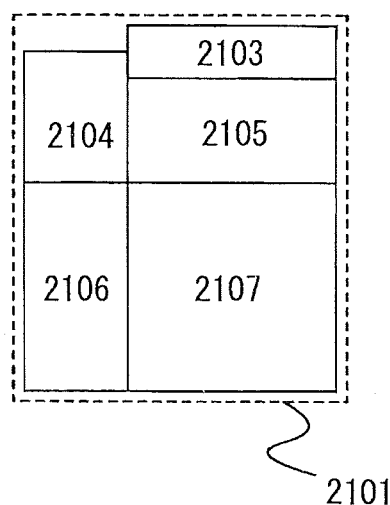
Figure 21C:
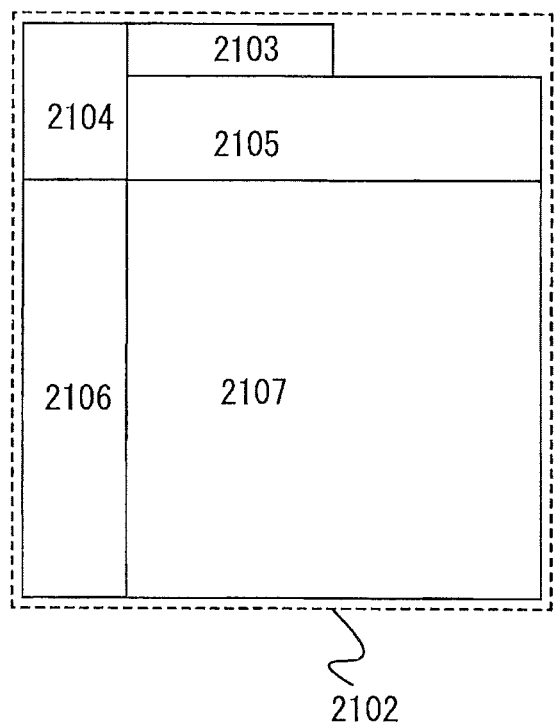

According to FIG. 20, the yield of writing of "A structure" is about 90%, whereas that of "B structure" is almost 100%. Accordingly, the yield of writing of "B structure" is higher than that of "A structure" although the assist capacitance value of "B structure" is lower than that of "A structure". Therefore, "A structure" is preferable for the present invention.

This application is based on Japanese Patent Application serial no. 2008-241792 filed with Japan Patent Office on Sep. 19, 2008, the entire contents of which are hereby incorporated by reference.

What is claimed is:

1. A semiconductor device comprising:
   a first flexible substrate;
   a memory cell over the first flexible substrate, the memory cell comprising:
      a transistor;
      a memory element; and
      a capacitor; and
   a second flexible substrate over the memory cell,
   wherein a first terminal of the transistor is directly connected to a first electrode of the memory element and a first electrode of the capacitor, and
   wherein a second electrode of the memory element is electrically connected to a second electrode of the capacitor.

2. The semiconductor device according to claim 1, wherein the first electrode of the capacitor comprises a first semiconductor material.

3. The semiconductor device according to claim 1, wherein each of the second electrode of the memory element and the second electrode of the capacitor comprises a first metal element.

4. The semiconductor device according to claim 1, wherein the first electrode of the capacitor comprises a first semiconductor material, and
   wherein each of the second electrode of the memory element and the second electrode of the capacitor comprises a first metal element.

5. The semiconductor device according to claim 1, wherein the first electrode of the capacitor comprises a first semiconductor material,
   wherein each of the second electrode of the memory element and the second electrode of the capacitor comprises a first metal element, and
   wherein each of the second electrode of the memory element and the second electrode of the capacitor is overlapped with the first electrode of the capacitor.

6. The semiconductor device according to claim 1, wherein the first electrode of the capacitor comprises a first semiconductor material,
   wherein each of the second electrode of the memory element and the second electrode of the capacitor comprises a first metal element, and
   wherein each of the second electrode of the memory element and the second electrode of the capacitor is overlapped with the first electrode of the capacitor,
   wherein the transistor comprises a semiconductor film comprising a channel formation region and a second semiconductor material, a gate insulating film, and a gate,
   wherein the capacitor comprises an insulating film between the first electrode of the capacitor and the second electrode of the capacitor,
   wherein each of the first semiconductor material and the second semiconductor material is a same semiconductor material,
   wherein each of the gate insulating film and the insulating film comprises an inorganic material,
   wherein the gate of the transistor comprises a second metal element, and
   wherein each of the first metal element and the second metal element is a same metal element.

7. The semiconductor device according to claim 1, wherein each of the second electrode of the memory element and the second electrode of the capacitor comprises tungsten.

8. The semiconductor device according to claim 1,
wherein the first electrode of the capacitor comprises a first semiconductor material and an impurity imparting p-type conductivity.

9. The semiconductor device according to claim 1, further comprising an antenna between the first flexible substrate and the second flexible substrate.

10. A semiconductor device comprising:
a first flexible substrate;
a memory cell over the first flexible substrate, the memory cell comprising:
a transistor;
a memory element; and
a capacitor;
a second flexible substrate over the memory cell,
wherein a first terminal of the transistor is electrically connected to a first electrode of the memory element, and
wherein a second electrode of the memory element is directly connected to a first electrode of the capacitor.

11. The semiconductor device according to claim 10,
wherein the first electrode of the capacitor comprises a first semiconductor material.

12. The semiconductor device according to claim 10,
wherein the second electrode of the memory element comprises a first metal element,
wherein a second electrode of the capacitor comprises a second metal element, and
wherein the first metal element and the second metal element is a same metal element.

13. The semiconductor device according to claim 10,
wherein the first electrode of the capacitor comprises a first semiconductor material,
wherein the second electrode of the memory element comprises a first metal element,
wherein a second electrode of the capacitor comprises a second metal element, and
wherein the first metal element and the second metal element is a same metal element.

14. The semiconductor device according to claim 10,
wherein the first electrode of the capacitor comprises a first semiconductor material,
wherein the second electrode of the memory element comprises a first metal element,
wherein a second electrode of the capacitor comprises a second metal element,
wherein the first metal element and the second metal element is a same metal element, and
wherein the second electrode of the capacitor is overlapped with the first electrode of the capacitor.

15. The semiconductor device according to claim 10,
wherein the first electrode of the capacitor comprises a first semiconductor material,
wherein the second electrode of the memory element comprises a first metal element,
wherein a second electrode of the capacitor comprises a second metal element,
wherein the second electrode of the capacitor is overlapped with the first electrode of the capacitor,
wherein the transistor comprises a semiconductor film comprising a channel formation region and a second semiconductor material, a gate insulating film, and a gate,
wherein the capacitor comprises an insulating film between the first electrode of the capacitor and the second electrode of the capacitor,
wherein each of the first semiconductor material and the second semiconductor material is a same semiconductor material,
wherein each of the gate insulating film and the insulating film comprises an inorganic material,
wherein the gate of the transistor comprises a third metal element, and
wherein each of the first metal element, the second metal element, and the third metal element is a same metal element.

16. The semiconductor device according to claim 10,
wherein the second electrode of the memory element comprises a first metal element,
wherein a second electrode of the capacitor comprises a second metal element, and
wherein each of the first metal element and the second metal element is tungsten.

17. The semiconductor device according to claim 10,
wherein the first electrode of the capacitor comprises a first semiconductor material and an impurity imparting p-type conductivity.

18. The semiconductor device according to claim 10, further comprising an antenna between the first flexible substrate and the second flexible substrate.

* * * * *